US008200468B2

(12) United States Patent
Ye et al.

(10) Patent No.: US 8,200,468 B2
(45) Date of Patent: Jun. 12, 2012

(54) METHODS AND SYSTEM FOR LITHOGRAPHY PROCESS WINDOW SIMULATION

(75) Inventors: Jun Ye, Palo Alto, CA (US); Yu Cao, Cupertino, CA (US); Hanying Feng, Fremont, CA (US)

(73) Assignee: ASML Netherlands B.V., Veldhoven (NL)

(*) Notice: Subject to any disclaimer, the term of this patent is extended or adjusted under 35 U.S.C. 154(b) by 763 days.

(21) Appl. No.: 12/315,849

(22) Filed: Dec. 5, 2008

(65) Prior Publication Data
US 2009/0157360 A1  Jun. 18, 2009

Related U.S. Application Data

(60) Provisional application No. 60/992,546, filed on Dec. 5, 2007.

(51) Int. Cl.
*G06F 17/50* (2006.01)

(52) U.S. Cl. .................. 703/13; 355/67; 716/54

(58) Field of Classification Search ............. 703/2, 13; 430/22, 30; 355/67; 716/4, 21, 5, 19, 52, 716/54; 382/124
See application file for complete search history.

(56) References Cited

U.S. PATENT DOCUMENTS

| | | | |
|---|---|---|---|
| 5,229,872 A | 7/1993 | Mumola et al. | |
| 5,296,891 A | 3/1994 | Vogt et al. | |
| 5,523,193 A | 6/1996 | Nelson | |
| 5,969,441 A | 10/1999 | Loopstra et al. | |
| 6,046,792 A | 4/2000 | Van der Werf et al. | |
| 7,003,758 B2 | 2/2006 | Ye et al. | |
| 7,343,271 B2* | 3/2008 | Gallatin et al. | 703/2 |
| 7,544,449 B1* | 6/2009 | Smith et al. | 430/30 |
| 7,853,920 B2* | 12/2010 | Preil et al. | 716/52 |
| 2002/0091986 A1* | 7/2002 | Ferguson et al. | 716/19 |
| 2005/0015233 A1* | 1/2005 | Gordon | 703/13 |
| 2005/0166174 A1* | 7/2005 | Ye et al. | 716/20 |
| 2005/0202328 A1* | 9/2005 | Smith et al. | 430/30 |
| 2006/0206851 A1 | 9/2006 | Van Wingerden et al. | |

(Continued)

FOREIGN PATENT DOCUMENTS

EP  1793279  6/2007

(Continued)

OTHER PUBLICATIONS

Cao, et al., "Optimized Hardware and Software for Fast, Full Chip Simulation", *SPIE*, vol. 5754, pp. 407-414 (2005).

(Continued)

*Primary Examiner* — Kandasamy Thangavelu
(74) *Attorney, Agent, or Firm* — Pillsbury Winthrop Shaw Pittman LLP

(57) ABSTRACT

A method of efficient simulating imaging performance of a lithographic process utilized to image a target design having a plurality of features. The method includes the steps of determining a function for generating a simulated image, where the function accounts for process variations associated with the lithographic process; and generating the simulated image utilizing the function, where the simulated image represents the imaging result of the target design for the lithographic process. In one given embodiment, the function for simulating the aerial images with focus and dose (exposure) variation is defined as:

$$I(x,f,1+\epsilon)=I_0(x)+\lfloor \epsilon \cdot I_0(x)+(1+\epsilon)\cdot a(x)\cdot (f-f_0)+(1+\epsilon)\cdot b(x)\cdot (f-f_0)^2 \rfloor$$

where $I_O$ represents image intensity at nominal focus and exposure, $f_O$ represents nominal focus, f and $\epsilon$ represent an actual focus-exposure level at which the simulated image is calculated, and parameters "a" and "b" represent first order and second order derivative images with respect to focus change.

22 Claims, 7 Drawing Sheets

U.S. PATENT DOCUMENTS

| | | | |
|---|---|---|---|
| 2007/0002300 A1* | 1/2007 | Hansen et al. | 355/67 |
| 2007/0121090 A1* | 5/2007 | Chen et al. | 355/67 |
| 2007/0124708 A1* | 5/2007 | Torres Robles et al. | 716/4 |
| 2007/0242251 A1* | 10/2007 | Hansen | 355/67 |
| 2008/0044748 A1* | 2/2008 | Han et al. | 430/22 |
| 2008/0127027 A1* | 5/2008 | Gallatin et al. | 716/19 |
| 2008/0127029 A1* | 5/2008 | Graur et al. | 716/21 |
| 2008/0168410 A1* | 7/2008 | Pikus et al. | 716/5 |
| 2008/0204690 A1* | 8/2008 | Berger et al. | 355/67 |
| 2008/0226157 A1* | 9/2008 | Stokowski | 382/144 |
| 2009/0123057 A1* | 5/2009 | Mukherjee et al. | 382/144 |

FOREIGN PATENT DOCUMENTS

| | | |
|---|---|---|
| JP | 07-175207 | 7/1995 |
| JP | 2001-350250 | 12/2001 |
| JP | 2002-131882 | 5/2002 |
| JP | 2002-260979 | 9/2002 |
| JP | 2003-532306 T | 10/2003 |
| JP | 2005-500671 T | 1/2005 |
| JP | 2006-512758 T | 4/2006 |
| JP | 2006-303498 | 11/2006 |
| JP | 2007-536581 T | 12/2007 |
| JP | 2009-508167 T | 2/2009 |
| KR | 2007-057059 | 6/2007 |
| WO | 01/84382 | 11/2001 |
| WO | 02/075793 | 9/2002 |
| WO | 2005/111874 | 11/2005 |
| WO | 2007/030704 A2 | 3/2007 |

OTHER PUBLICATIONS

Spence, "Full Chip Lithography Simulation and Design Analysis—How OPC is Changing IC Design", *SPIE*, vol. 5751, pp. 1-14 (2005).

Japanese Office Action mailed Apr. 18, 2011 in corresponding Japanese Patent Application No. 2008-305942.

* cited by examiner

METHODS AND SYSTEM FOR LITHOGRAPHY PROCESS WINDOW SIMULATION

CROSS REFERENCE TO RELATED APPLICATIONS

The present application claims priority to U.S. Provisional Application No. 60/992,546 filed 5 Dec. 2007, the contents of which is incorporated herein by reference in it's entirety.

TECHNICAL FIELD

The technical field of the present invention relates generally to a method and program product for performing simulation of the imaging results associated with a lithography process, and more specifically to a computationally efficient simulation process that accounts for parameter variations over a process window.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as 'Moore's law'. At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process, in which features with dimensions smaller than the classical resolution limit of an optical projection system are printed, is commonly known as low-$k_1$ lithography, according to the resolution formula $CD = k_1 \times \lambda / NA$, where $\lambda$ is the wavelength of radiation employed (currently in most cases 248 nm or 193 nm), NA is the numerical aperture of the projection optics, CD is the 'critical dimension'—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as 'resolution enhancement techniques' (RET).

As one important example, optical proximity correction (OPC, sometimes also referred to as 'optical and process correction') addresses the fact that the final size and placement of a printed feature on the wafer will not simply be a function of the size and placement of the corresponding feature on the mask. It is noted that the terms 'mask' and 'reticle' are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. The article "Full-Chip Lithography Simulation and Design Analysis—How OPC Is Changing IC Design", C. Spence, Proc. SPIE, Vol. 5751, pp 1-14 (2005) provides an overview of current 'model-based' optical proximity correction processes. In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature.

The application of model-based OPC to a target design requires good process models and considerable computational resources, given the many millions of features typically present in a chip design. However, applying OPC is generally not an 'exact science', but an empirical, iterative process that does not always resolve all possible weaknesses on a layout. Therefore, post-OPC designs, i.e. mask layouts after application of all pattern modifications by OPC and any other RET's, need to be verified by design inspection, i.e. intensive full-chip simulation using calibrated numerical process models, in order to minimize the possibility of design flaws being built into the manufacturing of a mask set. This is driven by the enormous cost of making high-end mask sets, which run in the multi-million dollar range, as well as by the impact on turn-around time by reworking or repairing actual masks once they have been manufactured.

Both OPC and full-chip RET verification may be based on numerical modeling systems and methods as described, for example in, U.S. Pat. No. 7,003,758 and an article titled "Optimized Hardware and Software For Fast, Full Chip Simulation", by Y. Cao et al., Proc. SPIE, Vol. 5754, 405 (2005).

While full-chip numerical simulation of the lithographic patterning process has been demonstrated at a single process condition, typically best focus and best exposure dose or best 'nominal' condition, it is well known that manufacturability of a design requires sufficient tolerance of pattern fidelity against small variations in process conditions that are unavoidable during actual manufacturing. This tolerance is commonly expressed as a process window, defined as the width and height (or 'latitude') in exposure-defocus space over which CD or edge placement variations are within a predefined margin (i.e., error tolerance), for example ±10% of the nominal line width. In practice, the actual margin requirement may differ for different feature types, depending on their function and criticality. Furthermore, the process window concept can be extended to other basis parameters in addition to or besides exposure dose and defocus.

Manufacturability of a given design generally depends on the common process window of all features in a single layer. While state-of-the-art OPC application and design inspection methods are capable of optimizing and verifying a design at nominal conditions, it has been recently observed that process-window aware OPC models will be required in order to ensure manufacturability at future process nodes due to ever-decreasing tolerances and CD requirements.

Currently, in order to map out the process window of a given design with sufficient accuracy and coverage, simulations at N parameter settings (e.g., defocus and exposure dose) are required, where N can be on the order of a dozen or more. Consequently, an N-fold multiplication of computation time is necessary if these repeated simulations at various settings are directly incorporated into the framework of an OPC application and verification flow, which typically will involve a number of iterations of full-chip lithography simulations. However, such an increase in the computational time is prohibitive when attempting to validate and/or design a given target circuit.

As such, there is a need for simulation methods and systems which account for variations in the process-window that can be used for OPC and RET verification, and that are more computationally efficient than such a 'brute-force' approach of repeated simulation at various conditions as is currently performed by known prior art systems.

In addition, calibration procedures for lithography models are required that provide models being valid, robust and accurate across the process window, not only at singular, specific parameter settings.

SUMMARY

Accordingly, the present invention relates to a method which allows for a computationally efficient technique for considering variations in the process window for use in a simulation process, and which overcomes the foregoing deficiencies of the prior art techniques.

More specifically, the present invention relates to a method of simulating imaging performance of a lithographic process utilized to image a target design having a plurality of features. The method includes the steps of determining a function for generating a simulated image, where the function accounts for process variations associated with the lithographic process; and generating the simulated image utilizing the function, where the simulated image represents the imaging result of the target design for the lithographic process. In one given embodiment, the function is defined as:

$$I(x,f) = I_0(x) + a(x)(f-f_0) + b(x)(f-f_0)^2$$

where $I_O$ represents image intensity at nominal focus, $f_O$ represents nominal focus, f represents an actual focus level at which the simulated image is calculated, and parameters "a" and "b" represent first order and second order derivative images.

The present invention provides significant advantages over prior art methods. Most importantly, the present invention provides a computational efficient simulation process with accounts for variations in the process window (e.g., focus variations and exposure dose variations), and eliminates the need to perform the 'brute-force' approach of repeated simulation at various conditions as is currently practiced by known prior art methods. Indeed, as further noted below, when considering N process window conditions for purposes of the simulation, the computation time of the present method is approximately 2T, whereas the prior art method would require approximately NT, where T denotes the computation time required for simulating one process window condition.

The method of the present invention is also readily applied to other applications such as, but not limited to, model calibration; lithography design inspection; yield estimates based on evaluation of common process windows; identification of hot spots (or problem spots) and correction of such hot-spots by utilizing process window aware OPC; and model-based process control corrections (e.g., to center the common process window for a given lithography layer in the lithography process).

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

a programmable LCD array. An example of such a construction is given in U.S. Pat. No. 5,229,872, which is incorporated herein by reference.

The invention itself, together with further objects and advantages, can be better understood by reference to the following detailed description and the accompanying schematic drawings.

DETAILED DESCRIPTION

Figure 1:
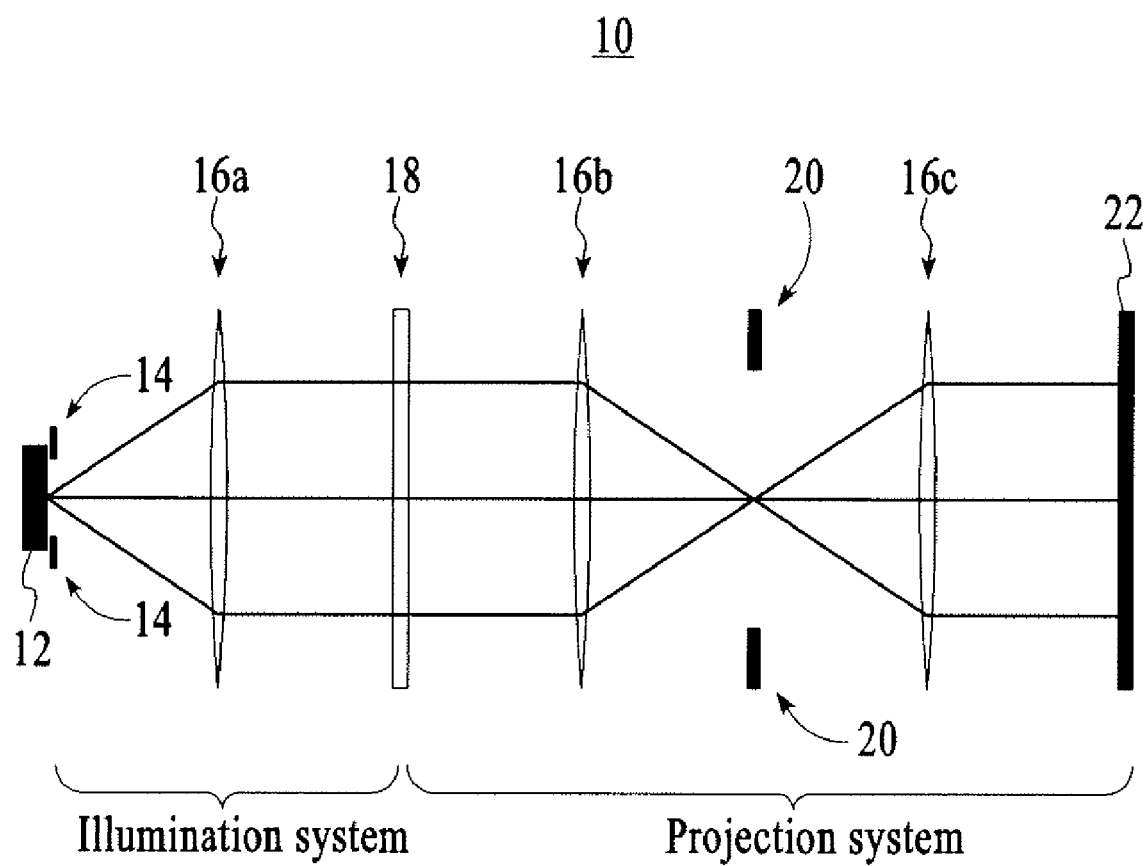
FIG. 1 is an exemplary block diagram illustrating a typical lithographic projection system.

Prior to discussing the present invention, a brief discussion regarding the overall simulation and imaging process is provided. FIG. 1 illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics NA=sin($\Theta_{max}$).

Figure 2:
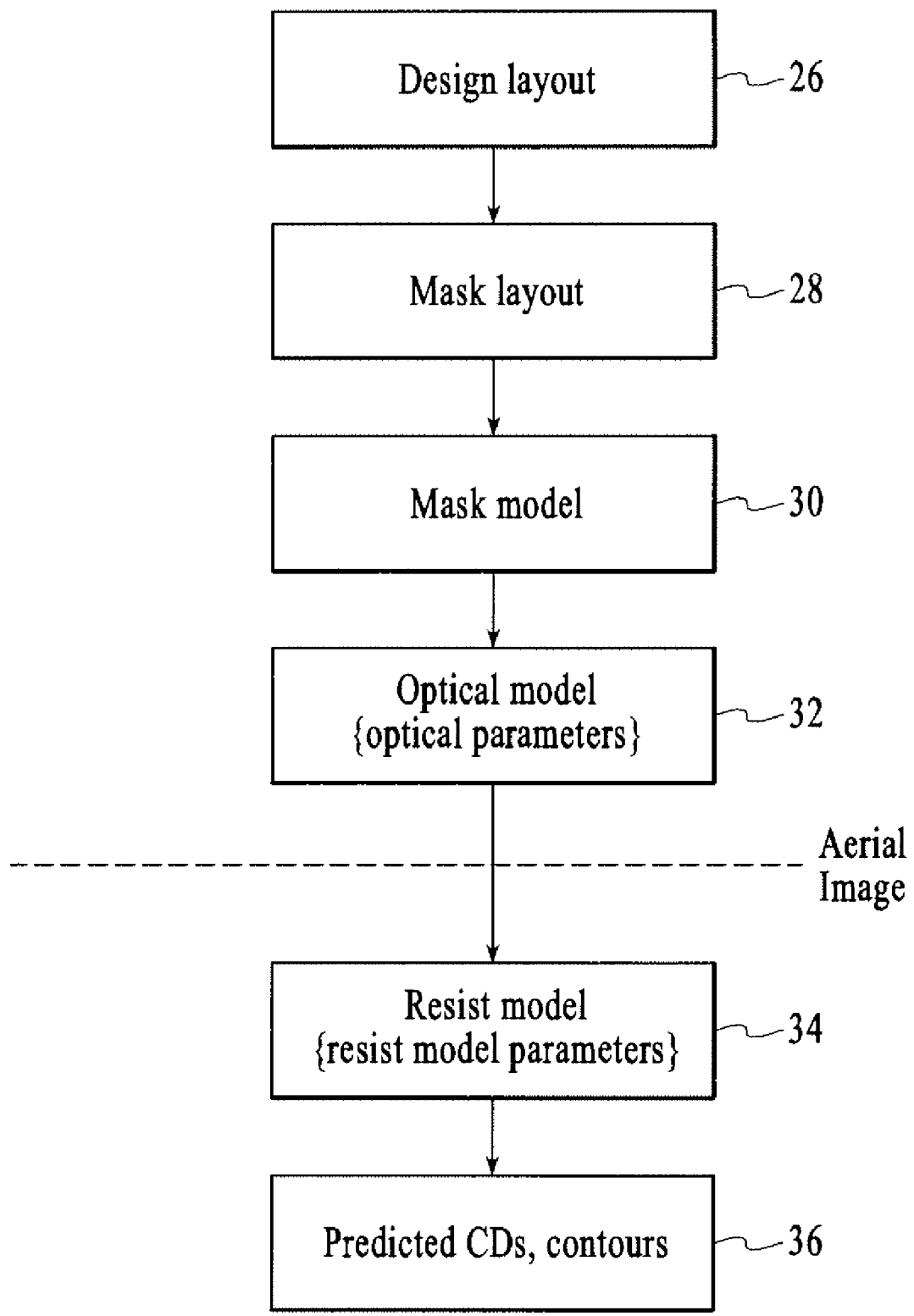
FIG. 2 is an exemplary block diagram illustrating the functional modules of a lithographic simulation model.

In a lithography simulation system, these major system components can be described by separate functional modules, for example, as illustrated in FIG. 2. Referring to FIG. 2, the functional modules include the design layout module 26, which defines the target design; the mask layout module 28, which defines the mask to be utilized in imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma ($\sigma$) settings as well as any particular illumination source shape. The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask, as described, for example, in U.S. Pat. No. 7,587,704. Finally, the resist model 34 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC mask layout, and will be provided in a standardized digital file format such as GDSII or OASIS.

In general, the connection between the optical and the resist model is a simulated aerial image within the resist layer, which arises from the projection of light onto the substrate, refraction at the resist interface and multiple reflections in the resist film stack. The light intensity distribution (aerial image) is turned into a latent 'resist image' by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image. An efficient implementation of a lithography model is possible using the following formalism, where the image (here in scalar form, which may be extended to include polarization vector effects) is expressed as a Fourier sum over signal amplitudes in the pupil plane. According to the standard Hopkins theory, the aerial image may be defined by:

$$I(x) = \sum_k \left| A(k) \sum_{k'} M(k'-k) P(k') \exp(-jk'x) \right|^2 \qquad \text{(Eq. 1)}$$

$$= \sum_k A(k)^2 \left\{ \sum_{k'} \sum_{k''} M(k'-k) P(k') M^*(k''-k) P^*(k'') \exp(-j(k'-k'')x) \right\}$$

$$= \sum_{k'} \sum_{k''} \left[ \sum_k A(k)^2 P(k+k') P^*(k+k'') \right] M(k') M^*(k'') \exp(-j(k'-k'')x)$$

$$= \sum_{k'} \sum_{k''} TCC_{k',k''} M(k') M^*(k'') \exp(-j(k'-k'')x)$$

where, $I(x)$ is the aerial image intensity at point x within the image plane (for notational simplicity, a two-dimensional coordinate represented by a single variable is utilized), k represents a point on the source plane, $A(k)$ is the source amplitude from point k, k' and k'' are points on the pupil plane, M is the Fourier transform of the mask image, P is the pupil function, and $TCC_{k',k''} = \sum_k A(k)^2 P(k+k') P^*(k+k'')$. An important aspect of the foregoing derivation is the change of summation order (moving the sum over k inside) and indices (replacing k' with k+k' and replacing k'' with k+k''), which results in the separation of the Transmission Cross Coefficients (TCCs), defined by the term inside the square brackets in the third line in the equation. These coefficients are independent of the mask pattern and therefore can be pre-computed using knowledge of the optical elements or configuration only (e.g., NA and σ or the detailed illuminator profile). It is further noted that although in the given example (Eq. 1) is derived from a scalar imaging model, this formalism can also be extended to a vector imaging model, where TE and TM polarized light components are summed separately.

Furthermore, the approximate aerial image can be calculated by using only a limited number of dominant TCC terms, which can be determined by diagonalizing the TCC matrix and retaining the terms corresponding to its largest eigenvalues, i.e., $$TCC_{k',k''} = \sum_{i=1}^N \lambda_i \phi_i(k') \phi_i^*(k'') \qquad \text{(Eq. 2)}$$

where $\lambda_i$ (i=1, . . . , N) denotes the N largest eigenvalues and $\phi_i(\cdot)$ denotes the corresponding eigenvector of the TCC matrix. It is noted that (Eq. 2) is exact when all terms are retained in the eigenseries expansion, i.e., when N is equal to the rank of the TCC matrix. However, in actual applications, it is typical to truncate the series by selecting a smaller N to increase the speed of the computation process.

Thus, (Eq. 1) can be rewritten as:

$$I(x) = \sum_{k'} \sum_{k''} TCC_{k',k''} M(k') M^*(k'') \exp(-j(k'-k'')x) \qquad \text{(Eq. 3)}$$

$$= \sum_{k'} \sum_{k''} \sum_{i=1}^N \lambda_i \phi_i(k') \phi_i^*(k'') M(k') M^*(k'') \exp(-j(k'-k'')x)$$

$$= \sum_{i=1}^N \lambda_i \sum_{k'} \phi_i(k') M(k') \exp(-jk'x) \sum_{k''} \phi_i^*(k'') M^*(k'') \exp(jk''x)$$

$$= \sum_{i=1}^N \lambda_i |\Phi_i(x)|^2$$

where $\Phi_i(x) = \sum_{k''} \phi_i(k'') M(k'') \exp(-jk''x)$ and $|\cdot|$ denotes the magnitude of a complex number.

Using a sufficiently large number of TCC terms and a suitable model calibration methodology allows for an accurate description of the optical projection process and provides for 'separability' of the lithographic simulation model into the optics and resist models or parts. In an ideal, separable model, all optical effects such as NA, sigma, defocus, aberrations etc. are accurately captured in the optical model module, while only resist effects are simulated by the resist model. In practice, however, all 'efficient' lithographic simulation models (as opposed to first-principle models, which are generally too slow and require too many adjustable parameters to be practical for full-chip simulations) are empirical to some extent and will use a limited set of parameters. There may in some cases be 'lumped' parameters that account for certain combined net effects of both optical and resist properties. For example, diffusion processes during PEB of resist can be modeled by a Gaussian filter that blurs the image formed in resist, while a similar filter might also describe the effect of stray light, stage vibration, or the combined effect of high-order aberrations of the projection system. Lumped parameters can reproduce process behavior close to fitted calibration points, but will have inferior predictive power compared with separable models. Separability typically requires a sufficiently detailed model form—in the example above, e.g., using 2 independent filters for optical blurring and resist diffusion—as well as a suitable calibration methodology that assures isolation of optical effects from resist effects.

While a separable model may generally be preferred for most applications, it is noted that the description of through-process window "PW" aerial image variations associated with the method of the present invention set forth below does not require strict model separability. Methods for adapting a general resist model in order to accurately capture through-PW variations are also detailed below in conjunction with the method of the present invention.

The present invention provides the efficient simulation of lithographic patterning performance covering parameter variations throughout a process window, i.e., a variation of exposure dose and defocus or additional process parameters. To summarize, using an image-based approach, the method provides polynomial series expansions for aerial images or resist images as a function of focus and exposure dose variations, or other additional coordinates of a generalized PW. These expressions involve images and derivative images which relate to TCCs and derivative TCC matrices. Linear combinations of these expressions allow for a highly efficient evaluation of the image generated at any arbitrary PW point. In addition, edge placement shifts or CD variations throughout the PW are also expressed in analytical form as simple linear combinations of a limited set of simulated images. This set of images may be generated within a computation time on the order of approximately 2 times the computation time for computing a single image at NC (Nominal Condition), rather than N× by computing images at N separate PW conditions. Once this set of images is known, the complete through-PW behavior of every single edge or CD on the design can be immediately determined.

It is noted that the methods of the present invention may also be utilized in conjunction with model calibration, lithography design inspection, yield estimates based on evaluating the common PW, identification of hot spots, modification and repair of hot spots by PW-aware OPC, and model-based process control corrections, e.g., to center the common PW of a litho layer.

The basic approach of the method can be understood by considering through-focus changes in resist line width (or edge placement) of a generic resist line. It is well known that the CD of the resist line typically has a maximum or minimum value at best focus, but the CD varies smoothly with defocus in either direction. Therefore, the through-focus CD variations of a particular feature may be approximated by a polynomial fit of CD vs. defocus, e.g. a second-order fit for a sufficiently small defocus range. However, the direction and magnitude of change in CD will depend strongly on the resist threshold (dose to clear), the specific exposure dose, feature type, and proximity effects. Thus, exposure dose and through-focus CD changes are strongly coupled in a non-linear manner that prevents a direct, general parameterization of CD or edge placement changes throughout the PW space.

However, the aerial image is also expected to show a continuous variation through focus. Every mask point may be imaged to a finite-sized spot in the image plane that is characterized by the point spread function of the projection system. This spot will assume a minimum size at best focus but will continuously blur into a wider distribution with both positive and negative defocus. Therefore, it is possible to approximate the variation of image intensities through focus as a second-order polynomial for each individual image point within the exposure field:

$$I(x,f) = I_0(x) + a(x) \cdot (f-f_0) + b(x) \cdot (f-f_0)^2 \quad \text{(Eq. 4)}$$

where $f_0$ indicates the nominal or best focus position, and $f$ is the actual focus level at which the image I is calculated. The second-order approximation is expected to hold well for a sufficiently small defocus range, but the accuracy of the approximation may easily be improved by including higher-order terms if required (for example, $3^{rd}$ order and/or $4^{th}$ order terms). In fact, (Eq. 4) can also be identified as the beginning terms of a Taylor series expansion of the aerial image around the nominal best focus plane:

$$I(x, f) = I(x, f_0) + \left.\frac{\partial I(x, f)}{\partial f}\right|_{f=f_0} \cdot (f - f_0) + 2\left.\frac{\partial^2 I(x, f)}{\partial f^2}\right|_{f=f_0} \cdot (f - f_0)^2 \quad \text{(Eq. 5)}$$

which can in principle be extended to an arbitrarily sufficient representation of the actual through-focus behavior of the aerial image by extension to include additional higher-order terms. It is noted that the choice of polynomial base functions is only one possibility to express a series expansion of the aerial image through focus, and the methods of the current invention are by no means restricted to this embodiment, e.g., the base functions can be special functions such as Bessel Functions, Legendre Functions, Chebyshev Functions, Trigonometric functions, and so on. In addition, while the process window term is most commonly understood as spanning variations over defocus and exposure dose, the process window concept can be generalized and extended to cover additional or alternative parameter variations, such as variation of NA and sigma, etc.

Comparison of (Eq. 4) and (Eq. 5) reveals the physical meaning of the parameters "a" and "b" as first and second-order derivative images. These may in principle be determined directly as derivatives by a finite difference method for every image point and entered into (Eq. 4) and (Eq. 5) to interpolate the image variations. Alternatively, in order to improve the overall agreement between the interpolation and the actual through focus variation over a wider range, the parameters a and b can be obtained from a least square fit of (Eq. 4) over a number of focus positions $\{f_1, f_2, \ldots, f_L\}$ for which aerial images are explicitly calculated as $\{I_1, I_2, \ldots, I_L\}$. The parameters "a" and "b" are then found as solutions to the following system of equations in a least square sense (assuming here that L>3, in which case the system of equations is over-determined).

Without loss of generality, it is assumed that $f_0=0$ so as to simplify the notation. Then for a fixed image point, $$I_1 = I_0 + a \cdot f_1 + b \cdot f_1^2$$

$$I_2 = I_0 + a \cdot f_2 + b \cdot f_2^2$$

$$\ldots$$

$$I_L = I_0 + a \cdot f_L + b \cdot f_L^2 \quad \text{(Eq. 6)}$$

where $I_0$ is the aerial image at nominal conditions (NC), i.e. $f=f_0$. The solution to the above set of equations minimizes the following sum of squared differences, with the index l referring to the L different focus conditions:

$$G = \sum_{l=1}^{L} W_l \cdot (I_l - I_0 - a \cdot f_l - b \cdot f_l^2)^2 \quad \text{(Eq. 7)}$$

where $W_l$ is a user-assigned weight to defocus $f_l$ (l= 1, 2, ..., L). Through $\{W_1, W_2, \ldots, W_L\}$, it is possible to assign different weights to different focuses. For example, in order to make the $2^{nd}$ order polynomial approximation have a better match at PW points closer to NC, it is possible to assign a larger weight close to NC and a smaller weight away from NC; or if it is desired for all focus points to have equal importance, one can simply assign equal weights, i.e., $W_1=W_2=\ldots=W_L=1$. For large deviations in focus and dose relative to the nominal condition, many patterns become unstable in printing and the measurements of CDs become unreliable, in such cases it may be desirable to assign small weights to such process window conditions.

To solve (Eq. 7), it is noted that the best fit will fulfill the conditions:

$$\frac{\partial G}{\partial a} \equiv 0, \text{ and } \frac{\partial G}{\partial b} \equiv 0 \quad (Eq.\ 8)$$

(Eq. 8) can be solved analytically, resulting in immediate expressions for "a" and "b" as the linear combination or weighted sum of the $\{I_l\}$, as shown below. The coefficients of this linear combination do not depend on the pixel coordinate or pattern, but only on the values of the $\{f_l\}$ and $\{W_l\}$. As such, these coefficients can be understood as forming a linear filter for the purpose of interpolation in the space of f, and the particular choice of polynomials as base functions gives rise to the specific values of the coefficients, independent of the mask pattern. More specifically, the calculation of these coefficients is performed once the values of $\{f_l\}$ and $\{W_l\}$ are determined, without knowing the specific optical exposure settings or actually carrying out aerial image simulations.

With regard to solving (Eq. 8), (Eq. 7) can be rewritten as:

$$G = \sum_{l=1}^{L} W_l \cdot (I_l - I_0 - a \cdot f_l - b \cdot f_l^2)^2$$

$$= \sum_{l=1}^{L} W_l \cdot (b \cdot f_l^2 + a \cdot f_l - \Delta I_l)^2$$

where $\Delta I_l = I_l - I_0$ for $l = 1, 2, \ldots, L$.

As a result, (Eq. 8) can be expanded as:

$$\frac{\partial G}{\partial a} = \sum_{l=1}^{L} W_l \cdot 2(b \cdot f_l^2 + a \cdot f_l - \Delta I_l) \cdot f_l \quad (Eq.\ 9)$$

$$= 2a \cdot \sum_{l=1}^{L} W_l \cdot f_l^2 + 2b \cdot \sum_{l=1}^{L} W_l \cdot f_l^3 -$$

$$2 \cdot \sum_{l=1}^{L} W_l \cdot \Delta I_l \cdot f_l$$

$$= 2a \cdot \alpha_2 + 2b \cdot \alpha_3 - 2\Phi_1$$

$$\equiv 0$$

$$\frac{\partial G}{\partial a} = \sum_{l=1}^{L} W_l \cdot 2(b \cdot f_l^2 + a \cdot f_l - \Delta I_l) \cdot f_l^2$$

$$= 2a \cdot \sum_{l=1}^{L} W_l \cdot f_l^3 + 2b \cdot \sum_{l=1}^{L} W_l \cdot f_l^4 -$$

$$2 \cdot \sum_{l=1}^{L} W_l \cdot \Delta I_l \cdot f_l^2$$

$$= 2a \cdot \alpha_3 + 2b \cdot \alpha_4 - 2\Phi_2$$

$$\equiv 0$$

-continued

Thus:

$$a = \frac{\alpha_4 \Phi_1 - \alpha_3 \Phi_2}{\alpha_2 \alpha_4 - \alpha_3^2} = \sum_{l=1}^{L} h_{al} \Delta I_l = \sum_{l=1}^{L} h_{al} (I_l - I_0),$$

$$b = \frac{\alpha_2 \Phi_2 - \alpha_3 \Phi_1}{\alpha_2 \alpha_4 - \alpha_3^2} = \sum_{l=1}^{L} h_{bl} \Delta I_l = \sum_{l=1}^{L} h_{bl} (I_l - I_0)$$

where $$\alpha_2 = \sum_{l=1}^{L} W_l \cdot f_l^2,\ \alpha_3 = \sum_{l=1}^{L} W_l \cdot f_l^3,\ \alpha_4 = \sum_{l=1}^{L} W_l \cdot f_l^4,$$

$$\Phi_1 = \sum_{l=1}^{L} W_l \cdot \Delta I \cdot f_l,\ \Phi_2 = \sum_{l=1}^{L} W_l \cdot \Delta I_l \cdot f_l^2,$$

$$h_{al} = \frac{W_l \cdot f_l \cdot (\alpha_4 - \alpha_3 \cdot f_l)}{\alpha_2 \alpha_4 - \alpha_3^2},\ h_{bl} = \frac{W_l \cdot f_l \cdot (\alpha_2 \cdot f_l - \alpha_3)}{\alpha_2 \alpha_4 - \alpha_3^2}$$

Note that:

$$\sum_{l=1}^{L} [h_{al} \cdot f_l] = \quad (Eq.\ 10)$$

$$\frac{\alpha_4 \cdot \sum_{l=1}^{L} [W_l \cdot f_l^2] - \alpha_3 \cdot \sum_{l=1}^{L} [W_l \cdot f_l^3]}{\alpha_2 \alpha_4 - \alpha_3^2} = \frac{\alpha_4 \alpha_2 - \alpha_3^2}{\alpha_2 \alpha_4 - \alpha_3^2} = 1$$

$$\sum_{l=1}^{L} [h_{al} \cdot f_l^2] = \frac{\alpha_4 \cdot \sum_{l=1}^{L} [W_l \cdot f_l^3] - \alpha_3 \cdot \sum_{l=1}^{L} [W_l \cdot f_l^4]}{\alpha_2 \alpha_4 - \alpha_3^2} =$$

$$\frac{\alpha_4 \alpha_3 - \alpha_3 \alpha_4}{\alpha_2 \alpha_4 - \alpha_3^2} = 0$$

$$\sum_{l=1}^{L} [h_{bl} \cdot f_l] = \frac{\alpha_2 \cdot \sum_{l=1}^{L} [W_l \cdot f_l^3] - \alpha_3 \cdot \sum_{l=1}^{L} [W_l \cdot f_l^2]}{\alpha_2 \alpha_4 - \alpha_3^2} =$$

$$\frac{\alpha_2 \alpha_3 - \alpha_3 \alpha_2}{\alpha_2 \alpha_4 - \alpha_3^2} = 0$$

$$\sum_{l=1}^{L} [h_{bl} \cdot f_l^2] = \frac{\alpha_2 \cdot \sum_{l=1}^{L} [W_l \cdot f_l^4] - \alpha_3 \cdot \sum_{l=1}^{L} [W_l \cdot f_l^3]}{\alpha_2 \alpha_4 - \alpha_3^2} =$$

$$\frac{\alpha_2 \alpha_4 - \alpha_3^2}{\alpha_2 \alpha_4 - \alpha_3^2} = 1$$

As is made clear below, this property will be useful in the resist model section. The above set of equations can be readily generalized to accommodate a higher-order polynomial fitting.

The benefit of introducing the derivative images "a" and "b" is that using (Eq. 4), the aerial image can be predicted at any point of the process window by straightforward scaling of the a and b images by the defocus offset and a simple addition, rather than performing a full image simulation (i.e., convolution of the mask pattern with the TCCs) at each particular defocus setting required for a PW analysis. In addition, changes in exposure dose can be expressed by a simple upscaling or downscaling of the image intensity by a factor $(1+\epsilon)$:

$$I(x,f,1+\epsilon)=(1+\epsilon)\cdot I(x,f) \quad (Eq.\ 11)$$

where $I(x,f)$ is the aerial image at the nominal exposure dose, while $\epsilon$ is the relative change in dose.

Combining this with (Eq. 4) yields the general result:

$$I(x, f, 1+\varepsilon) = (1+\varepsilon) \cdot [I_0(x) + a(x) \cdot (f - f_0) + \qquad \text{(Eq. 12)}$$
$$b(x) \cdot (f - f_0)^2]$$
$$= I_0(x) + [\varepsilon \cdot I_0(x) + (1+\varepsilon) \cdot a(f - f_0) +$$
$$(1+\varepsilon) \cdot b(x) \cdot (f - f_0)^2]$$
$$= I_0(x) + \Delta I(x)$$

where ΔI will typically be small perturbations within a reasonable range of PW parameter variations.

Figure 3:
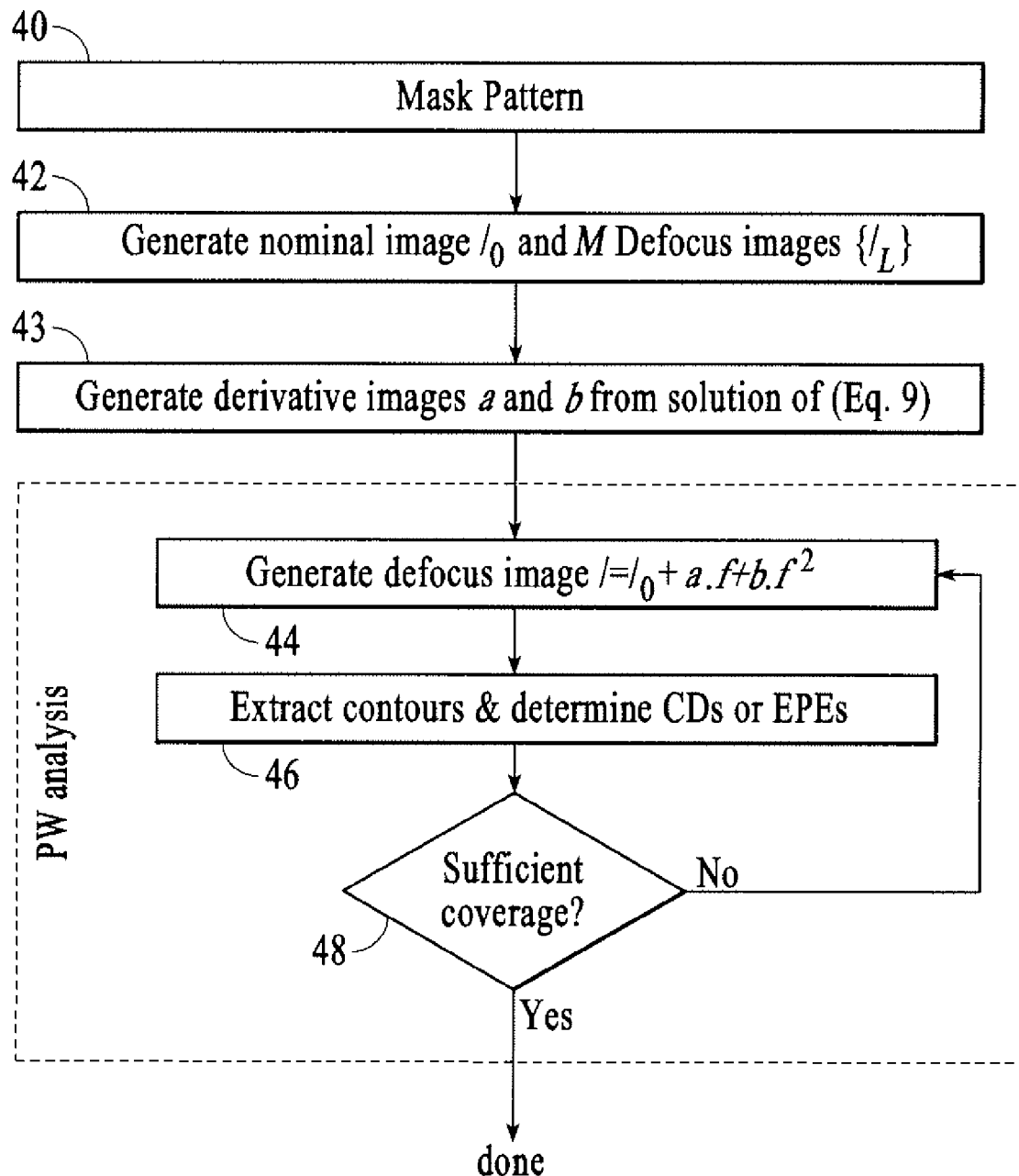
FIG. 3 illustrates an exemplary flowchart of a first embodiment of the present invention.

The foregoing method is exemplified by a flow diagram in FIG. 3 where the contours, CD or Edge Placement Errors (EPEs) are to be extracted from the aerial image at different defocus conditions. Referring to FIG. 3, the first step (Step 40) in the process is to identify the target pattern or mask pattern to be simulated and the process conditions to be utilized. The next step (Step 42) is to generate a nominal image $I_O$ and M defocus images $\{I_1\}$ in accordance with (Eq. 3) above. Thereafter, derivative images "a" and "b" are generated utilizing (Eq. 9) (Step 43). The next step (Step 44) entails generating the defocus image utilizing (Eq. 4), i.e., the synthesis of $I_0$, a (scaled by f) and b (scaled by $f^2$). Next, contours are extracted and CDs or feature EPEs are determined from the simulated image (Step 46). The process then proceeds to Step 48 to determine whether or not there is sufficient coverage (e.g., whether it is possible to determine the boundary of the process window) and if the answer is no, the process returns to Step 44 and repeats the foregoing process. If there is sufficient coverage, the process is complete.

It is noted that if a sufficient coverage of the process window requires evaluation at N process window points, and L<N images are used for fitting the derivative images a and b, the reduction in computation time will be close to L/N, since scaling the predetermined images $I_0$, a and b requires significantly less computation time than an independent re-calculation of the projected image at each new parameter setting. The foregoing method is generally applicable, independent of the specific details of the aerial image simulation. Furthermore, it is also applicable to both the aerial image as well as to the resist image from which simulated resist contours are extracted.

The foregoing method also does not depend on any specific model or implementation used for simulating the set of aerial images $\{I_1, I_2, \ldots, I_L\}$ at varying defocus. However, the foregoing method requires a number L>2 of individual images to be simulated for each mask layout under consideration. In a second embodiment of the method of the present invention, an even more efficient solution is made possible by the TCC formalism introduced in (Eq. 1).

From (Eq. 1), each aerial image at focus $f_l$ (l=0, 1, ..., L) can be defined as:

$$I_l(x) = \Sigma_{k'} \Sigma_{k''} TCC_{l,k',k''} M(k') M^*(k'') \exp(-j(k'-k'')x)$$

where $TCC_l$ is the TCC at focus $f_l$ and $TCC_{l,k',k''}$ is the matrix element of $TCC_l$, and M(•) represents the mask image, which is independent of the focus.

Combining this with (Eq. 9) and exchanging the order of summation, $$a = \sum_{l=1}^{L} h_{al}(I_l - I_0) \qquad \text{(Eq. 13)}$$
$$= \sum_{l=1}^{L} h_{al} \left( \sum_{k'} \sum_{k''} TCC_{l,k',k''} M(k') M^*(k'') \exp \right.$$
$$(-j(k'-k'')x) - \sum_{k'} \sum_{k''} TCC_{0,k',k''} M(k')$$
$$\left. M^*(k'') \exp(-j(k'-k'')x) \right)$$
$$= \sum_{k'} \sum_{k''} \left[ \sum_{l=1}^{L} h_{al}(TCC_{l,k',k''} - TCC_{0,k',k''}) \right]$$
$$M(k') M^*(k'') \exp(-j(k'-k'')x)$$

$$b = \sum_{l=1}^{L} h_{bl}(I_l - I_0)$$
$$= \sum_{l=1}^{L} h_{bl} \left( \sum_{k'} \sum_{k''} TCC_{l,k',k''} M(k') M^*(k'') \exp \right.$$
$$(-j(k'-k'')x) - \sum_{k'} \sum_{k''} TCC_{0,k',k''} M(k')$$
$$\left. M^*(k'') \exp(-j(k'-k'')x) \right)$$
$$= \sum_{k'} \sum_{k''} \left[ \sum_{l=1}^{L} h_{bl}(TCC_{l,k',k''} - TCC_{0,k',k''}) \right] M(k')$$
$$M^*(k'') \exp(-j(k'-k'')x)$$

Thus if two new TCCs are defined as linear combinations of $TCC_l$ (l=0, 1, ..., L) in the following way:

$$A = \sum_{l=1}^{L} h_{al} \Delta TCC_l = \sum_{l=1}^{L} h_{al}(TCC_l - TCC_0), \qquad \text{(Eq. 14)}$$
$$B = \sum_{l=1}^{L} h_{bl} \Delta TCC_l = \sum_{l=1}^{L} h_{bl}(TCC_l - TCC_0)$$

then "a" and "b" are "aerial images" which can be computed directly from A and B, i.e., $$a(x) = \sum_{k'} \sum_{k''} A_{k',k''} M(k') M^*(k'') \exp(-j(k'-k'')x) \qquad \text{(Eq. 15)}$$
$$b(x) = \sum_{k'} \sum_{k''} B_{k',k''} M(k') M^*(k'') \exp(-j(k'-k'')x)$$

where $A_{k',k''} = \sum_{l=1}^{L} h_{al}(TCC_{l,k',k''} - TCC_{0,k',k''})$ and $$B_{k',k''} = \sum_{l=1}^{L} h_{bl}(TCC_{l,k',k''} - TCC_{0,k',k''})$$

are the matrix elements of A and B, respectively. This also implies that a linear combination of aerial images of different planes can be computed using a single linear combination of TCCs corresponding to those planes.

A significant advantage of using $TCC_0$, A, and B in place of the L through-focus images is that the $TCC_0$, A, and B can be pre-computed, independently of the actual mask pattern, for known illumination and projection parameters, giving rise to the possibility of further reduction of computing time (down from L through-focus simulations for each mask pattern), which will be further explained below. It is noted that the generation of A and B neither requires computation of a set of aerial images at different defocus conditions nor requires calibration from this set of aerial images. Once $TCC_0$, A, and B have been calculated, these terms can be generally applied to predict the through-focus imaging performance for any specific mask design using (Eq. 15) and (Eq. 4). Besides the through-focus variation, a variation of exposure dose around nominal condition can be applied to the TCC terms by the same linear scaling as described by (Eq. 11) and (Eq. 12) above.

Calculating the derivative images a and b from TCCs A and B allows a further reduction of computation time by using only the dominant terms of A and B, as in the discussions related to (Eq. 2). More specifically, suppose the diagonalization of $TCC_0$, A and B is:

$$TCC_0 = \sum_{i=1}^{N_0} \lambda_{0,i} \phi_{0,i}(k') \phi_{0,i}(k'') \qquad \text{(Eq. 16)}$$

$$A = \sum_{i=1}^{N_A} \lambda_{A,i} \phi_{A,i}(k') \phi_{A,i}(k'')$$

$$B = \sum_{i=1}^{N_B} \lambda_{B,i} \phi_{B,i}(k') \phi_{B,i}(k'')$$

where $\lambda_{0,i}$ (i=1, ..., $N_0$) denotes the $N_0$ largest eigenvalues and $\phi_{0,i}(\bullet)$ denotes the corresponding eigenvector of the TCC matrix $TCC_0$; $\lambda_{A,i}$ (i=1, ..., $N_A$) denotes the $N_A$ largest eigenvalues and $\phi_{A,i}(\bullet)$ denotes the corresponding eigenvector of the TCC matrix A; and $\lambda_{B,i}$ (i=1, ..., $N_B$) denotes the $N_B$ largest eigenvalues and $\phi_{B,i}(\bullet)$ denotes the corresponding eigenvector of the TCC matrix B.

Then, from (Eq. 3), for mask image M(•), $$I_0(x) = \sum_{i=1}^{N_0} \lambda_{0,i} |\Phi_{0,i}(x)|^2 \qquad \text{(Eq. 17)}$$

$$a(x) = \sum_{i=1}^{N_A} \lambda_{A,i} |\Phi_{A,i}(x)|^2$$

$$b(x) = \sum_{i=1}^{N_B} \lambda_{B,i} |\Phi_{B,i}(x)|^2$$

where $I_0$ is the nominal aerial image, $$\Phi_{0,i}(x) = \sum_{k''} \phi_{0,i}(k'') M(k'') \exp(-jk''x),$$

$$\Phi_{A,i}(x) = \sum_{k''} \phi_{A,i}(k'') M(k'') \exp(-jk''x) \text{ and}$$

$$\Phi_{B,i}(x) = \sum_{k''} \phi_{B,i}(k'') M(k'') \exp(-jk''x).$$

Utilizing a larger number of TCC terms generally improves the accuracy of the optical model and the separability of optical and resist model components. However, since the image or TCC derivatives relate to relatively minor image variations within the PW, typically on the order of 10% in CD variation, a smaller number of terms may suffice for the A and B terms than for the Nominal Condition $TCC_0$. For example, if 64 terms are considered for $TCC_0$, (i.e., $N_0$=64), only 32 terms are typically required for each of the A and B terms in order to achieve sufficient CD prediction accuracy, i.e., $N_A$=$N_B$=32. In this case, approximately the same amount of computation time will be required to generate the derivative images a and b as compared to the nominal condition $I_0$. It is noted that, unlike the original TCC matrices, a coefficient TCC matrix such as A or B is in general not non-negative-definite, which implies both positive and negative eigenvalues exist for a derivative TCC matrix. Therefore, the leading terms from the eigen-series expansion and truncation should include all eigenvalues with the largest absolute values, both positive and negative.

Similar to (Eq. 5), (Eq. 14) can be derived alternatively from series expansion. More specifically, the variation of TCC matrix elements around nominal or best focus $f_0$ may also be expressed as a series expansion:

$$TCC_{k',k''}(f) = TCC_{k',k''}(f_0) + \frac{\partial TCC_{k',k''}(f)}{\partial f}\bigg|_{f=f_0} \cdot (f - f_0) + \qquad \text{(Eq. 18)}$$

$$2\frac{\partial^2 TCC_{k',k''}(f)}{\partial f^2}\bigg|_{f=f_0} \cdot (f - f_0)$$

Thus, the coefficients of the series expansion may be evaluated directly by a numerical finite difference method, or again from a least-square fitting to a number of individually calculated TCC terms corresponding to a set of focus positions, in a manner similar to the through-focus fitting of aerial images discussed in the previous section. The fitting approach provides a wider range of validity, and introduces weight factors to place more or less emphasis on certain parts of the PW. This approach will follow (Eq. 6)-(Eq. 9) after replacing the set of test images $I_l$ by their corresponding TCCs in the equations. Consequently, the best fit derivative matrices A and B are obtained from the same linear combination set forth above, also after formally replacing the $I_l$ by $TCC_l$, i.e., $$A = \sum_{l=1}^{L} h_{al} \Delta TCC_l = \sum_{l=1}^{L} h_{al}(TCC_l - TCC_0), \qquad \text{(Eq. 19)}$$

$$B = \sum_{l=1}^{L} h_{bl} \Delta TCC_l = \sum_{l=1}^{L} h_{bl}(TCC_l - TCC_0)$$

where $h_{al}$ and $h_{bl}$ are again computed using (Eq. 9). It is noted that $h_{al}$ and $h_{bl}$ are constants that do not depend on the patterns or $TCC_l$. Thus, A and B are simply a linear combination of the Nominal Condition $TCC_0$ and a set of TCC's at various defocus conditions ($TCC_1$ through $TCC_L$).

Note that (Eq. 19) is the same as (Eq. 14), thus these two alternative approaches lead to the same final formulation. Similarly, (Eq. 4) can also be derived from (Eq. 15), (Eq. 18), and (Eq. 19).

Figure 4:
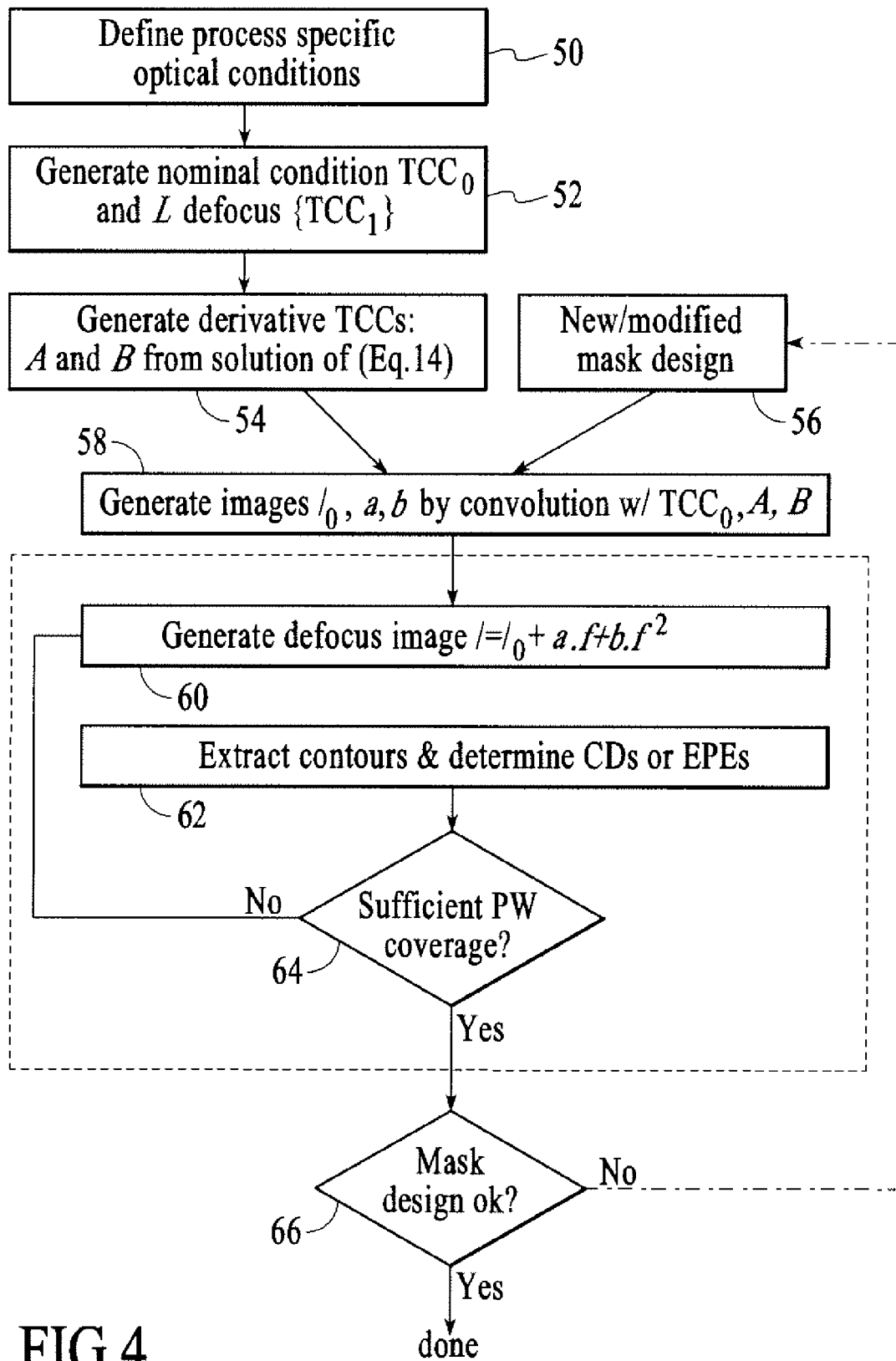
FIG. 4 illustrates an exemplary flowchart of a second embodiment of the present invention.

The method of the second embodiment is exemplified by the flow diagram in FIG. 4 where the contours, CD or Edge Placement Errors (EPEs) are to be extracted from the aerial image at different defocus conditions. The first step (Step 50) in the process is to identify the process specific optical conditions associated with the desired process. The next step (Step 52) is to generate a nominal condition $TCC_O$ and L defocus $\{TCC_i\}$. Thereafter, derivative TCCs: A and B are generated utilizing (Eq. 14) (Step 54). The next step (Step 58) generates images $I_0$, a, b by convolution of the mask image with $TCC_0$, A and B utilizing (Eq. 17). Next, for each mask design (Step 56), defocus image is synthesized utilizing (Eq. 4) (Step 60), thereby generating the simulated image. Next, contours are extracted and CDs or feature EPEs are determined from the simulated image (Step 62). The process then proceeds to Step 64 to determine whether or not there is sufficient coverage to determine the boundary of the process window and if the answer is no, the process returns to Step 58 and repeats the foregoing process. If there is sufficient coverage, the process proceeds to Step 66 to determine if the image produced by the mask design is within allowable error tolerances, and if so, the process is complete. If not, the process returns to Step 56 so as to allow for adjustment and redesign of the mask. It is noted that this last step is an optional step in the process.

In the flowchart of FIG. 4, the diagram shows PW analysis embedded within a 'mask variation loop' which may be required, in particular, for iterative, PW-aware OPC modifications of an initial mask design. In this situation, any improvement in computation speed for the through-PW image assessment will be especially beneficial.

An additional reduction in computation time may be achieved by further suitable assumptions or a priori knowledge about the physics of the optical system. For example, in the absence of strong aberrations, it can be expected that the through-focus variation of aerial image intensities will be an even (i.e. symmetrical) function of defocus. Therefore, it can be expected that the first-order derivatives "A" and "a" will be negligible under these conditions.

This simplification can be further justified by noting that the effect of defocus corresponds to a multiplication of the pupil function by a phase factor $p=p_0 \exp[ja(f-f_0)^2]$, where the nominal focus is at $f_0=0$. For small defocus the phase shift can be approximated by a Taylor expansion: $p=p_0 \cdot [1+ja(f-f_0)^2]$, which does not contain a linear term.

All the above methods may also be extended to a generalized process window definition that can be established by different or additional base parameters in addition to exposure dose and defocus. These may include, but are not limited to, optical settings such as NA, sigma, aberrations, polarization, or optical constants of the resist layer (whose effects on the imaging process are included in the optical model, i.e. the TCCs). As one example, including a variation of NA around nominal conditions, the aerial image can be expressed as:

$$I(f,NA)=I_0+a \cdot (f-f_0)+b \cdot (f-f_0)^2+c \cdot (NA-NA_0)+d \cdot (NA-NA_0)^2+e \cdot (f-f_0) \cdot (NA-NA_0) \quad \text{(Eq. 20)}$$

where I, $I_0$, a, . . . , e are 2-dimensional images and image derivatives, respectively. The additional parameters "c", "d", and "e" can be determined by a least square fit to a set of simulated images or a set of simulated TCCs at varying parameter values for f and NA, while the scaling with exposure dose as in (Eq. 11) and (Eq. 12) still applies. It is noted that, similar to (Eq. 9), these parameters (a, b, c, d, and the cross-term coefficient e) are again a linear combination of aerial images $\{I_i\}$. The coefficients of this linear combination do not depend on the pixel coordinate or pattern, but only on the values of the $\{f_i\}$, $\{NA_i\}$, and/or the user-assigned weights $\{W_i\}$.

For this generalized PW model, simplifications based on physical insight are also possible. In case of NA variations, for example, it can be expected that these will have a rather monotonous, linear effect on the image variations, in which case (Eq. 20) can be simplified by dropping the higher order "d" and "e" terms in NA, possibly in addition to the linear term in defocus. Also, for any generalized PW definition, the number of TCC terms used for calculating $I_0$ at Nominal Condition need not be the same as the number of terms used for calculating image variations from the TCC derivatives A, B, . . . . A sufficiently accurate description of minor image variations due to small parameter variations around Nominal Condition may be achieved with a large number of terms for $I_0$ and a significantly smaller number for the derivatives, in order to reduce the overall computation time.

For simplicity purposes, the following discussion will be based on defocus and exposure dose. However, it should be noted that all the disclosures herein can be extended to generalized PW with other parameters such as NA, sigma, aberrations, polarization, or optical constants of the resist layer, as illustrated in (Eq. 20).

In the embodiments set forth above, analytic expressions for the aerial image in the vicinity of best focus for a range of PW parameters were developed. The following descriptions derive similar expressions and methods to calculate the resist image, which forms the basis for extraction of simulated resist contours across the PW.

Separable, Linear Resist Model

Although the response of photo resist to illumination by the projected aerial image may be strongly nonlinear, having a thresholding behavior, many processes occurring in the resist layer, such as diffusion during PEB, can be modeled by convoluting the aerial image with one or more linear filters before applying the threshold. Such models will be generally referred to as 'linear' resist models, and the latent resist image for such models may be expressed schematically as:

$$R(x)=P\{I(x)\}+R_b(x) \quad \text{(Eq. 21)}$$

here, $P\{\ \}$ denotes the functional action of applying a linear filter (i.e. generally a convolution), while $R_b$ is a mask loading bias that is independent of the aerial image. The resist threshold is understood to be included in $R_b$ such that resist contours correspond to locations where $R(x)=0$.

Applying this model to the general, scaled, interpolated aerial image derived above, i.e., (Eq. 12, assuming $f_0=0$ without loss of generality), results in $$\begin{aligned} R &= [P\{I_0\} + R_b] + \varepsilon \cdot P\{I_0\} + (1+\varepsilon) \cdot f \cdot P\{a\} + \\ &\quad (1+\varepsilon) \cdot f^2 \cdot P\{b\} \\ &= R_0 + \varepsilon \cdot P\{I_0\} + (1+\varepsilon) \cdot f \cdot P\{a\} + (1+\varepsilon) \cdot f^2 \cdot P\{b\} \\ &= R_0 + \Delta R(x, \varepsilon, f) \end{aligned} \quad \text{(Eq. 22)}$$

where $R_0$ is the resist image at Nominal Condition (NC). All corrections due to changes in exposure dose and focus (or, other PW parameters) are derived by applying the same filter to the derivative images a, b as to the image $I_0$ at NC, and simple scaling and summation of the correction terms.

Moreover, the effect of a linear filter may be included in the imaging TCC formalism, since the convolution with a filter in the space domain is equivalent to a multiplication with the filter's Fourier series components in the frequency domain. Starting from an aerial image expression (Eq. 1):

$$I(x)=\Sigma_{k'}\Sigma_{k''} TCC_{k',k''} M(k') M^*(k'') \exp(-j(k'-k'')x)$$

It is shown that the TCC matrix element at k', k" contributes to the (k'-k") frequency component of I(x) by the amount $TCC_{k',k''} M(k') M^*(k'')$. Therefore, a resist image defined by:

$$I(x) \otimes g(x)$$

where g(x) is a spatial filter with the Fourier transform being G(k), can be expressed as:

$$I(x) \otimes g(x) = \sum_{k'} \sum_{k''} TCC_{k',k''} M(k')M^*(k'')\exp(-j(k'-k'')x)G(k'-k'')$$

$$= \sum_{k'} \sum_{k''} TCC^{new}_{k',k''} M(k')M^*(k'')\exp(-j(k'-k'')x)$$

with a new TCC matrix defined as $$TCC^{new}_{k',k''} = TCC_{k',k''} G(k'-k'')$$

With this procedure, the linear filter is incorporated into the bi-linear TCC matrix, so all the computational procedures applicable to a purely optical aerial image may be applied to the linearly filtered aerial image. This property allows a significant reduction in overall computation time, since the complete resist image can be generated by a single evaluation of (Eq. 1), with the only modification of adding weight factors corresponding to the Fourier coefficients of the filter P. For any given mask design input, this formulation would allow to generate directly, in one pass each, the images $P\{I_0\}$, $P\{a\}$, $P\{b\}$ from the pre-computed, filter-adjusted $TCC_0$, A, and B matrices. (Eq. 22) then defines the actual resist image for any arbitrary PW point as a linear combination of these three images.

Non-Separable, Linear Resist Model

In the preceding discussion, it was implicitly assumed that all parameters of the linear filters establishing the resist model are constant across the variations of the process window parameters. This equates to one condition for an overall separable lithography model: resist model parameters are independent of optical model parameters. A pragmatic test for separability is the ability to accurately calibrate the model and fit test data across the complete extent of the PW. In practice, the semi-empirical nature of models suitable for full-chip lithography simulation may preclude perfect separability and may require resist model parameters that are allowed to vary with PW parameters such as defocus, NA or sigma settings. For a physically motivated model, it should be expected (or required as a constraint), though that the model parameters vary smoothly under variation of the PW variables. In this case, the series expansion of the resist image may include derivative terms of the resist model parameters.

For illustration purposes, consider defocus as the only PW parameter. If the linear resist model is equivalent to a convolution with a linear filter, (or a multitude of linear filters), a separable model may be described by:

$$R(x,f) = P(x) \otimes I(x,f) + R_b(x) \quad \text{(Eq. 23)}$$

while a non-separable model may require an explicit f-dependence of the filter $$R(x,f) = P(x,f) \otimes I(x,f) + R_b(x) \quad \text{(Eq. 24)}$$

Now, considering through-focus changes, a pro-forma series expansion may be applied to (Eq. 24), for illustration herein only up to first order:

$$R(x,f) = R(x,f_0) + [a_P(x) \otimes I_0(x) + P(x,f_0) \otimes a(x)] \cdot \quad \text{(Eq. 25)}$$
$$(f - f_0) + \ldots$$
$$= R_0(x) + \Delta R(x,f)$$

where $$a_P(x) = \left.\frac{\partial P(x,f)}{\partial f}\right|_{f=f_0} \quad \text{(Eq. 26)}$$

If the resist model parameters are found to vary continuously across the PW space, similar series expansion and fitting as introduced above for the AI and TCCs can be applied to the resist model parameters during model calibration. In this case a linear, derivative filter $a_P$ can be calculated and be used in (Eq. 25), which may also be extended in a straightforward way to include higher-order terms. In this situation, resist model parameters as well as aerial image variations are smoothly interpolated across the complete PW area. Both P and $a_P$ can be determined in a through-PW model calibration step based on experimental wafer data from test or gauge patterns.

However, even if resist model parameters appear to vary non-monotonously across the PW, any piece-wise interpolation in between calibration points could provide 'best-guess' resist model parameters for arbitrary PW points.

General Resist Model

For a general resist model that may include nonlinear operations such as truncations of the aerial or resist image, the straightforward separation into nominal condition and derivative terms, as shown in (Eq. 22) will be no longer valid. However, there are three alternative methods to deal with the non-linear operations.

i) Associated Linear Filter

First, it is assumed that the general variation of the resist image through PW can be approximated formally by the second line in (Eq. 22), with the reinterpretation that the linear filter P{ } will no longer correctly describe the resist model at NC (Normal Condition). Instead, linear filter P{ } will be chosen to reproduce the best representation of differential resist image changes relative to the NC. While a nonlinear model may ensure the most accurate model fitting at the NC, it may require significantly more computation time than a linear model. By relying on such an associated linear filter to emulate the differential through-PW behavior, only a single evaluation of the nonlinear model will be required to generate $R_0(x)$, while PW analysis at a multitude of PW conditions can be based on more efficient evaluation of $P\{I_0\}$, $P\{a\}$, $P\{b\}$.

The coefficients of the nominal condition resist model as well as of the associated filter may be determined from a unified model calibration procedure based on calibration test patterns and wafer gauge data covering pattern variations and process window variations, as an extension of the method described in U.S. P App. No. 60/719,837.

Further, once a valid unified PW model (FEM) has been generated and calibrated in the manner set forth in U.S. P App. No. 60/719,837, it will provide the best prediction of through-PW changes of the resist image. The parameters of the optimum associated filter may then be determined by minimizing the overall (RMS (root mean square)) difference between the simplified model using the associated filter and the complete, calibrated model, without any need for additional experimental calibration data.

Using the full model, for any suitable number and range of test structures, including e.g. 1-D (line/space) and 2-D (line ends etc) patterns, 'correct' resist images and contours can be simulated for any number of PW points. In addition, the values of the derivative images a and b can be calculated in the vicinity of the resist contours. For each pattern, the change of R(x) through-PW will be calculated at pattern-specific gauge points, e.g. the tip of a line for a line-end test pattern, or along any point of the NC resist contour. At each of these evaluation points $x_i$ through $$\Delta R(x_i, \epsilon, f) = R(x_i, \epsilon, f) - R(x_i, \epsilon=0, f=f_0) = R(x_i, \epsilon, f) \quad \text{(Eq. 27)}$$

since $x_i$ is assumed to be on a resist contour, where $R(x_i, \epsilon=0, f=f_0)=0$.

ΔR(x_i,ϵ,f) should be well approximated by $$\Delta R_a(x_i) = \epsilon \cdot P\{I_0(x_i)\} + (1+\epsilon) \cdot f \cdot P\{a(x_i)\} + (1+\epsilon) \cdot f^2 \cdot P\{b(x_i)\}$$ (Eq. 28)

Therefore, the optimal associated filter will minimize the sum of squared differences between (Eq. 27) and (Eq. 28), and can be determined by a variety of known optimization algorithms. It is noted that evaluation of (Eq. 27) and (Eq. 28) during the associated filter fitting should be performed at resist contours, so that the resulting filter most closely reproduces changes close to edge positions. Performance of the associated filter—in terms of accurately predicting changes in the resist image level—far away from edge positions is generally not required. After this fitting routine, the full-PW behavior of the resist images is again described as $$R(x,\epsilon,f) = R_0(x) + \Delta R_a(x,\epsilon,f)$$ (Eq. 29)

where the filtered differential images can be efficiently calculated within the TCC formalism, the ΔR constitutes relatively small perturbations, and the resist images at any arbitrary PW point can be predicted from a simple linear combination of the four images $R_0$, $P\{I_0\}$, $P\{a\}$, and $P\{b\}$.

ii) Embedded Linearization

The above approach presents a linearized filter (i.e., the associated filter) which is optimal in that it is the single linear filter which minimizes the (RMS) difference for all pattern-specific gauge points or along any point of the NC (Nominal Condition) resist contour. Next, an alternative approach is discussed which incorporates resist model linearization in the computation of derivative resist images.

More specifically, after obtaining a and b in (Eq. 2), the goal becomes identifying $R_0$, Ra and Rb such that their linear combination (assuming that $f_0=0$ without loss of generality)

$$R_{EL}(x,f) = R_0(x) + Ra(x) \cdot f + Rb(x) \cdot f^2$$ (Eq. 30)

is the best fit for $$R(x, f_l) = R\{I(x, f_l)\}$$ (Eq. 31)
$$= R\{I_0(x) + a(x) \cdot f_l + b(x) \cdot f_l^2\}$$

over a number of focus positions $f_l = \{f_1, f_2, \ldots, f_L\}$ with possibly a set of weights $\{W_1, W_2, \ldots, W_L\}$, where $R_0$ is the resist image at NC. (Eq. 31) is essentially applying the resist model $R\{\bullet\}$ to the aerial image expressed in (Eq. 2). It is noted that the resist model $R\{\bullet\}$ may be non-linear, thus Ra and Rb are not necessarily $P\{a\}$ and $P\{b\}$ or $R\{a\}$ and $R\{b\}$.

As such:

$$R_0(x) = R(I_0(x))$$ (Eq. 32)

$$Ra(x) = \sum_{l=1}^{L} h_{al}[R(x, f_l) - R_0(x)]$$

$$Rb(x) = \sum_{l=1}^{L} h_{bl}[R(x, f_l) - R_0(x)]$$

where $h_{al}$ and $h_{bl}$ are coefficients defined in (Eq. 9). The coefficients only depend on $\{f_1, f_2, \ldots, f_L\}$ and possibly weights $\{W_1, W_2, \ldots, W_L\}$, and they are independent of $R(x, f_l)$ or $I(x, f_l)$.

In general, the resist model $R\{\bullet\}$ can be separated as:

$$R\{I(x)\} = P\{I(x)\} + P_{NL}\{I(x)\} + R_b$$ (Eq. 33)

where $R_b$ is a mask loading bias that is independent of the aerial image I(x) or focus, P{ } is the linear filter operation and $P_{NL}\{$ $\}$ is some non-linear operation.

Combining (Eq. 32) and (Eq. 33), $$Ra(x) = \sum_{l=1}^{L} h_{al}[R(x, f_l) - R_0(x)]$$ (Eq. 34)

$$= \sum_{l=1}^{L} h_{al}[P\{I(x, f_l)\} - P\{I_0(x)\}] +$$

$$\sum_{l=1}^{L} h_{al}[P_{NL}\{I(x, f_l)\} - P_{NL}\{I_0(x)\}]$$

$$Rb(x) = \sum_{l=1}^{L} h_{bl}[R(x, f_l) - R_0(x)]$$

$$= \sum_{l=1}^{L} h_{bl}[P\{I(x, f_l)\} - P\{I_0(x)\}] +$$

$$\sum_{l=1}^{L} h_{bl}[P_{NL}\{I(x, f_l)\} - P_{NL}\{I_0(x)\}]$$

As discussed previously, since P{ } is a linear operation, then $$P\{I(x, f_l)\} = P\{I_0(x) + a(x) \cdot f_l + b(x) \cdot f_l^2\}$$ (Eq. 35)

$$= P\{I_0(x)\} + P\{a(x)\} \cdot f_l + P\{b(x)\} \cdot f_l^2$$

As expected, it is possible to derive the following result with the aid of (Eq. 9) and (Eq. 10) set forth above, $$\sum_{l=1}^{L} h_{al}[P\{I(x, f_l)\} - P\{I_0(x)\}]$$ (Eq. 36)

$$= \sum_{l=1}^{L} h_{al}[P\{a(x)\} \cdot f_l + P\{b(x)\} \cdot f_l^2]$$

$$= P\{a(x)\} \cdot \sum_{l=1}^{L} [h_{al} \cdot f_l] + P\{b(x)\} \cdot \sum_{l=1}^{L} [h_{al} \cdot f_l^2]$$

$$= P\{a(x)\}$$

$$\sum_{l=1}^{L} h_{bl}[P\{I(x, f_l)\} - P\{I_0(x)\}]$$

$$= \sum_{l=1}^{L} h_{bl}[P\{a(x)\} \cdot f_l + P\{b(x)\} \cdot f_l^2]$$

$$= P\{a(x)\} \cdot \sum_{l=1}^{L} [h_{bl} \cdot f_l] + P\{b(x)\} \cdot \sum_{l=1}^{L} [h_{bl} \cdot f_l^2]$$

$$= P\{b(x)\}$$

Thus, Ra and Rb can computed from $$Ra(x) = P\{a(x)\} + \sum_{l=1}^{L} h_{al}[P_{NL}\{I(x, f_l)\} - P_{NL}\{I_0(x)\}]$$ (Eq. 37)

$$Rb(x) = P\{b(x)\} + \sum_{l=1}^{L} h_{bl}[P_{NL}\{I(x, f_l)\} - P_{NL}\{I_0(x)\}]$$

The benefits of this approach are that it does not attempt to capture the differential through-PW behavior for all gauge points using a single linear filter. Rather, this approach minimizes the (RMS) difference for each pixel, thereby improving the overall accuracy. In addition, this approach does not require identification of pattern-specific gauge points or all NC resist contour neighboring points. One drawback is that this approach slightly increases the computation complexity for Ra and Rb. However, since the synthesis of through-PW resist images only require scaling and additions of $R_0$, Ra and Rb, the increase in the computation complexity of the derivative images is generally insignificant compared to the reduction in computation complexity of through-PW resist images, especially for dense PW sampling.

iii) Polynomial Approximation of Non-Linear Operations

In a third approach, non-linear resist model operations are approximated using polynomials. More specifically, for truncation operations on image I(x), for the purpose of emulating acid and base reaction effects, quadratic polynomials of the image provide a sufficient approximation. Another typical non-linear operation, the linear filtering of the image slope, can be expressed precisely as the linear filtering of a quadratic function of the image gradient $G\{I(x)\}=I(x)-I(x-1)$, thus the quadratic polynomial of the aerial image I(x) itself. More specifically, letting $G\{\ \}$ be the gradient operation and the linear filter be $P_{slope}\{\bullet\}$ then this non-linear operation can be expressed as:

$$P_{Slope}\{G\{I(x)\}\} = P_{slope}\{(I(x)-I(x-1))^2\} \quad \text{(Eq. 38)}$$

To summarize, the resist image from aerial image I(x) can be approximated as:

$$I(x, f)\} = P_1\{I(x, f)\} + P_2\{I^2(x, f)\} + \quad \text{(Eq. 3}$$
$$R_b(x) + P_{Slope}\{(I(x, f) - I(x-1, f))^2\}$$
$$= P_1\{I_0(x) + a(x) \cdot f + b(x) \cdot f^2\} +$$
$$P_2\{(I_0(x) + a(x) \cdot f + b(x) \cdot f^2)^2\} + R_b(x) +$$
$$P_{Slope}\{(I_0(x) + a(x) \cdot f + b(x) \cdot f^2 - I_0(x-1) - a(x-1) \cdot f -$$
$$b(x-1) \cdot f^2)^2\}$$
$$= P_1\{I_0(x)\} + P_1\{a(x)\} \cdot f + P_1\{b(x)\} \cdot f^2 + P_2\{I_0^2(x)\} +$$
$$2P_2\{a(x) \cdot I_0(x)\} \cdot f + P_2\{2b(x) \cdot I_0(x) + a^2(x)\} \cdot f^2 +$$
$$2P_2\{a(x) \cdot b(x)\} \cdot f^3 + P_2\{b^2(x)\} \cdot f^4 + R_b(x) +$$
$$P_{Slope}\{(G\{I_0\}(x) + G\{a\}(x) \cdot f + G\{b\}(x) \cdot f^2)^2\}$$
$$= \{P_1\{I_0(x)\} + P_2\{I_0^2(x)\} + P_{Slope}\{G^2\{I_0\}(x)\} + R_b(x)\} +$$
$$\{P_1\{a(x)\} + 2P_2\{a(x) \cdot I_0(x)\} +$$
$$2P_{Slope}\{G\{a\}(x) \cdot G\{I_0\}(x)\}\} \cdot f +$$
$$\{P_1\{b(x)\} + P_2\{2b(x) \cdot I_0(x) + a^2(x)\} +$$
$$P_{Slope}\{2G\{a\}(x) \cdot G\{I_0\}(x) + G^2\{a\}(x)\}\} \cdot f^2 +$$
$$2\{P_2\{a(x) \cdot b(x)\} + P_{Slope}\{G\{a\}(x) \cdot G\{b\}(x)\}\} \cdot f^3 +$$
$$\{P_2\{b^2(x)\} + P_{Slope}\{G^2\{b\}(x)\}\} \cdot f^4$$
$$= R_0(x) + R_1(x) \cdot f + R_2(x) \cdot f^2 + R_3(x) \cdot f^3 + R_4(x) \cdot f^4$$

Once again, $P_1\{\bullet\}$ represents the linear filter for the aerial image term, $P_2\{\bullet\}$ represents the linear filter for the aerial image square term, and $P_{slope}\{\bullet\}$ represents the linear filter for the aerial image gradient term, while $R_b$ is a mask loading bias that is independent of the image pattern. Thus the resist image is expressed as a $4^{th}$-order polynomial of the defocus value. However, in a typical application, $R_3(x)$ and $R_4(x)$ are very small and may be ignored to improve the computational efficiency.

As noted above, the goal of lithography design verification is to ensure that printed resist edges and line widths are within a pre-specified distance from the design target. Similarly, the size of the process window—exposure latitude and depth of focus—are defined by CDs or edge placements falling within the specified margin. The various methods outlined above provide very efficient ways to determine the change of resist image signal level with variation of focus and exposure dose or other, generalized PW parameters. Each method resulted in an approximate expression of through-PW resist image variations $\Delta R$ as perturbation of the NC (Nominal Condition) image $R_0$.

In order to relate these changes in R(x) to changes in edge placement, in most cases a first-order approximation will suffice, due to the small CD or edge placement tolerances. Therefore, the lateral shift of any resist contour (R=0) (i.e., the edge placement change) is simply approximated by the image gradient G at the original (i.e. NC) contour location and the change in resist image level $\Delta R$ due to variation of focus, dose, etc. as:

$$\Delta EP(x_i, \varepsilon, f) = \frac{\Delta R(x_i, \varepsilon, f)}{G(x_i, \varepsilon = 0, f = f_0)} \quad \text{(Eq. 40)}$$

where both the initial contour location and the gradient are determined from the resist image at NC, i.e. $R_0(x,y)$. The 2-dimensional edge shift can be calculated separately in x and y direction by the partial image derivative in each direction, or as an absolute shift using an absolute gradient value, i.e. the geometrical sum of $S_x = R_0(x,y) - R_0(x-1,y)$ and $S_y = R_0(x,y) - R_0(x,y-1)$, i.e., the absolute gradient value $S = \sqrt{S_x^2 + S_y^2}$.

From the foregoing explanation, the edge shift can be directly expressed as a function of the differential images defined above:

$$\Delta EP(x_i, \varepsilon, f) = \quad \text{(Eq. 41)}$$
$$\frac{1}{S(x_i)} [\varepsilon \cdot P\{I_0(x_i)\} + (1+\varepsilon) \cdot f \cdot P\{a(x_i)\} + (1+\varepsilon) \cdot f^2 \cdot P\{b(x_i)\}]$$

while changes in CD or line widths can be determined from adding the individual edge placement shifts on either side of a line, resulting generally in $\Delta CD = 2 \cdot \Delta EP$. Clearly, (Eq. 41) will be able to reproduce the typical $2^{nd}$ order-like through-focus behavior of CD or EPE curves. More importantly, after the set of images such as $[R_0, P\{I_0\}, P\{a\}, P\{b\}]$ has been calculated, which may be accomplished with only ~1× more computation than simulating the single image at NC (assuming that fewer TCC terms are required for sufficient accuracy on the differentials), (Eq. 41) may be applied to map out analytically the complete PW for every single edge position on a design, without the need for any further time-consuming image simulation. A generic flow diagram to illustrate this method is provided in FIG. 5.

Figure 5:
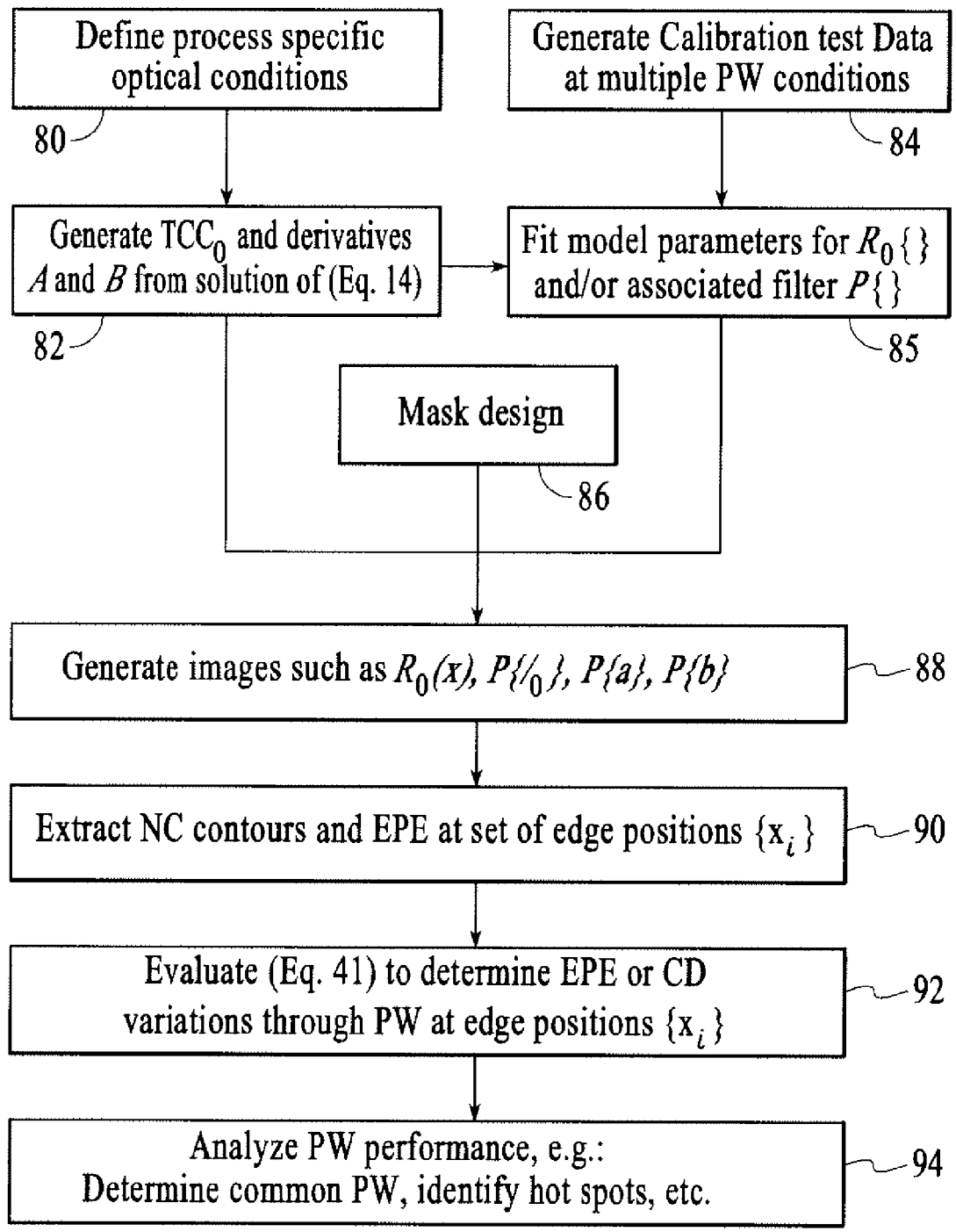
FIG. 5 illustrates an exemplary flowchart of a third embodiment of the present invention.

Referring to FIG. 5, the first step (Step 80) entails defining the process specific parameters associated with the lithography process and system that will be utilized in the imaging process. Thereafter, derivative TCCs A and B are generated utilizing (Eq. 14) (Step 82). In Step 84, calibration test data is acquired for multiple process window conditions. In Step 85, model parameters for $R_O\{\}$ and/or associated filter $P\{\}$ are determined utilizing in part the results of Step 82. Next, the target mask pattern or design is defined (Step 86). The process then proceeds to generate images such as $R_O(x)$, $P\{I_O\}$, $P\{a\}$ and $P\{b\}$ in Step 88. Next, the simulated image is synthesized, NC contours are extracted, and feature EPEs are determined at a given set of edge positions $\{x_i\}$ (Step 90). The process then proceeds to Step 92 to determine EPE or CD variations through process window at edge positions $\{x_i\}$. Finally, in Step 94, the results obtained in Step 92 are analyzed to determine whether the resulting image is within a predefined error tolerance, thus, determining a common process window as well as identifying any problem area (i.e., hot-spots) within the design.

The methods detailed above, and in particular (Eq. 41) can be applied very flexibly for a wide range of tasks in lithography design inspection. Some of these applications are briefly outlined below. However, it is noted that the present invention is not limited to the applications disclosed herein.

For any particular edge or CD, (Eq. 41) allows straightforward determination of the focus latitude (=DOF (Depth of Focus)) at nominal dose, for a given tolerance of CD, EP or line end variation.

For any particular edge or CD, (Eq. 41) allows straightforward determination of the exposure dose at nominal focus, for a given tolerance of CD, EP or line end variation.

For any particular edge or CD, (Eq. 41) allows straightforward mapping of the shape, center and area of the PW in $\{F,E\}$ space or a generalized PW space, for a given tolerance of CD, EP or line end variation.

For a set of edges or CDs covering the full chip design and all relevant pattern/feature types, the common process window of the design can be efficiently calculated, and process corrections may be derived in order to center the common PW.

Critical, limiting patterns may be identified that define the inner boundaries of the common PW, by either having off-centered PWs or small PWs.

The common PW area may be mapped out as a function of tolerance specs on EP or CD variations. This sensitivity analysis may provide a yield estimate depending on design sensitivity.

Design hot spots may be identified from a full-chip analysis using (Eq. 41), as patterns with PW area, DOF or exposure latitude falling below a certain threshold. The behavior of these critical patterns may then be investigated in detail by full-PW simulations, i.e. using the full simulation model for repeated image and resist contour simulation at many points across the PW.

Figure 6:
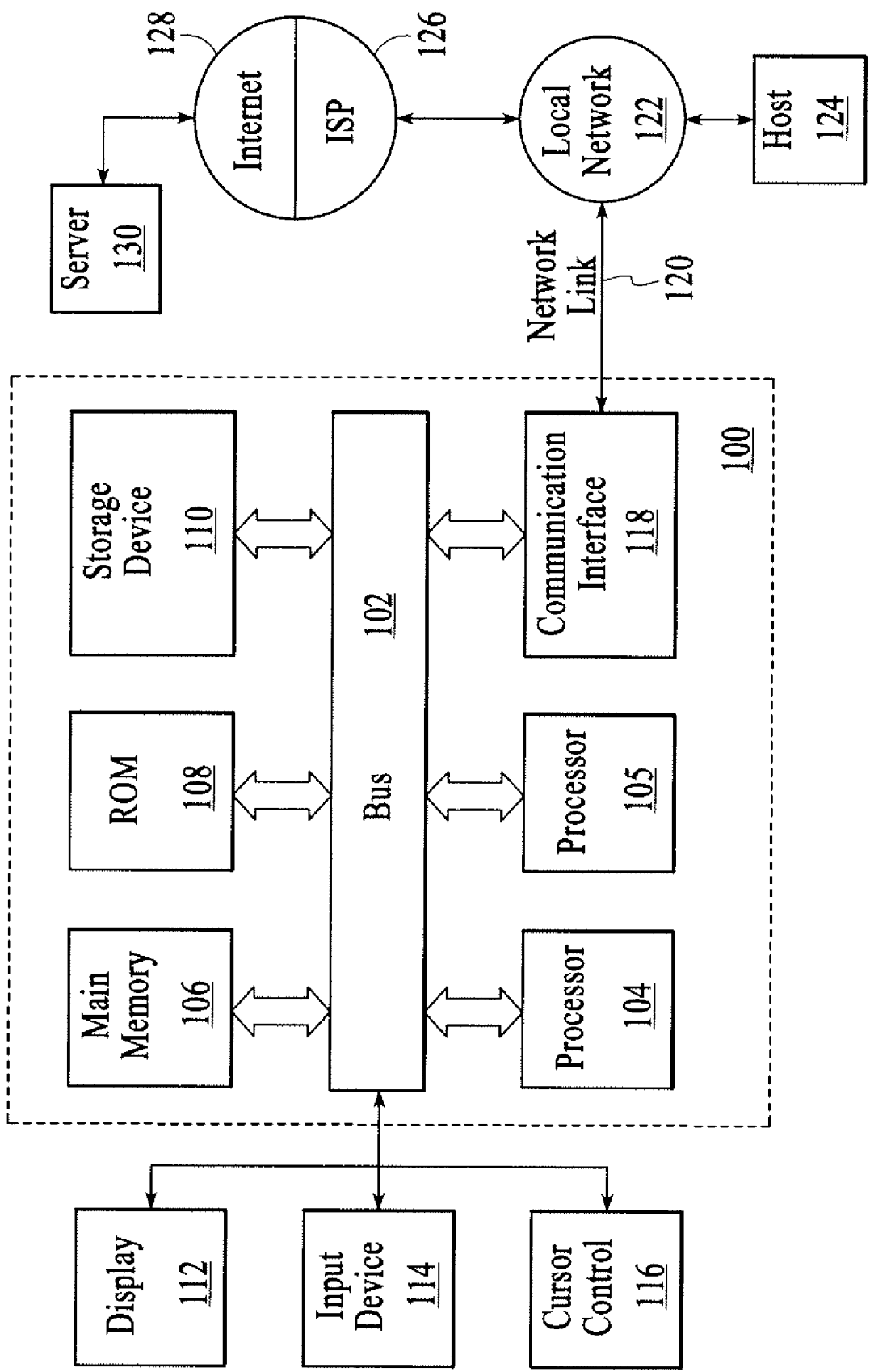
FIG. 6 is a block diagram that illustrates a computer system which can assist in the implementation of the simulation method of the present invention.

FIG. 6 is a block diagram that illustrates a computer system 100 which can assist in the simulation method disclosed herein. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions. Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software. The term "computer-readable medium" as used herein refers to any medium that participates in providing instructions to processor 104 for execution. Such a medium may take many forms, including but not limited to, non-volatile media, and volatile media. Non-volatile media include, for example, optical or magnetic disks, such as storage device 110. Volatile media include dynamic memory, such as main memory 106. Common forms of computer-readable media include, for example, a floppy disk, a flexible disk, hard disk, magnetic tape, any other magnetic medium, a CD-ROM, DVD, any other optical medium, a RAM, a PROM, and EPROM, a FLASH-EPROM, any other memory chip or cartridge, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information. Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 7:
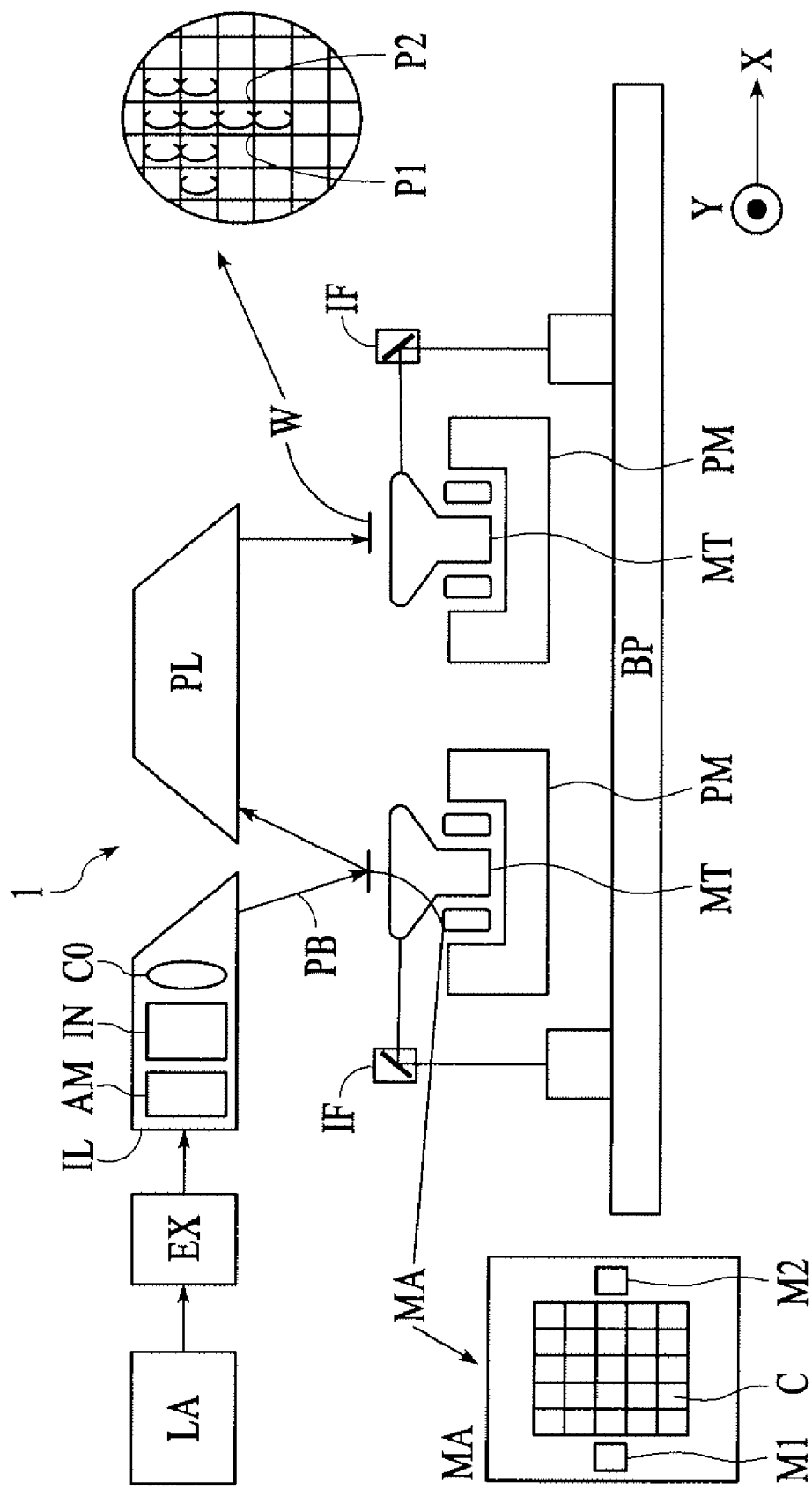
FIG. 7 schematically depicts a lithographic projection apparatus suitable for use with the method of the present invention.

FIG. 7 schematically depicts an exemplary lithographic projection apparatus whose performance could be simulated utilizing the process of present invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 7 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 7. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been described and illustrated in detail, it is to be clearly understood that the same is by way of illustration and example only and is not to be taken by way of limitation, the scope of the present invention being limited only by the terms of the appended claims.

We claim:

1. A computer-implemented method of simulating imaging performance of a lithographic process utilized to image a target design having a plurality of features, said method comprising:
   determining, using a computer, a function for generating a simulated image, said function having one or more variables accounting for process window variations from a nominal process condition associated with said lithographic process; and
   generating, using the computer, said simulated image utilizing said function; said simulated image representing an imaging result of said target design for said lithographic process.

2. The computer-implemented method of simulating imaging performance of a lithographic process according to claim 1, wherein said function includes a polynomial function of the process window variations, and said process window variations include variations in at least one of focus and exposure dose.

3. The computer-implemented method of simulating imaging performance of a lithographic process according to claim 2, wherein said process window variations further include variations in optical settings including at least one of numerical aperture and sigma.

4. The computer-implemented method of simulating imaging performance of a lithographic process according to claim 2, wherein said function is defined as:

$$I(x,f,1+\epsilon)=I_0(x)+[\epsilon \cdot I_0(x)+(1+\epsilon)\cdot a(x)\cdot (f-f_0)+(1+\epsilon)\cdot b(x)\cdot (f-f_0)^2]$$

where I represents image intensity at actual focus and exposure, $I_0$ represents image intensity at nominal focus and exposure, x is a point at which the image intensity is determined, $f_0$ represents nominal focus, f and $\epsilon$ represent an actual focus and exposure level at which the simulated image is calculated, and parameters "a" and "b" represent first order and second order derivative images with respect to focus change.

5. The computer-implemented method of simulating imaging performance of a lithographic process according to claim 2, wherein said function is defined as: $I(x,f,1+\epsilon)=I_0(x)+[\epsilon \cdot I_0(x)+(1+\epsilon)\cdot a(x)\cdot (f-f_0)+(1+\epsilon)\cdot b(x)\cdot (f-f_0)^2]$ where I represents image intensity at actual focus and exposure, $I_0$ represents image intensity at nominal focus and exposure, x is a point at which the image intensity is determined, $f_0$ represents nominal focus, f and $\epsilon$ represent an actual focus and exposure level at which the simulated image is calculated, and parameters "a" and "b" represent best fit of a series of aerial images at different focuses.

6. The computer-implemented method of simulating imaging performance of a lithographic process according to claim 2, wherein said function is defined as:

$$I(x,f,1+\epsilon)=I_0(x)+[\cdot I_0(x)+(1+\epsilon)\cdot a(x)\cdot (f-f_0)+(1+\epsilon)\cdot b(x)\cdot (f-f_0)^2]$$

where I represents image intensity at actual focus and exposure, $I_0$ represents image intensity at nominal focus and exposure x is a point at which the image intensity is determined, $f_0$ represents nominal focus, f and $\epsilon$ represent an actual focus and exposure level at which the simulated image is calculated, and parameters "a" and "b" represent the aerial images computed from Transmission Cross Coefficients (TCCs) A and B which are linear combinations of a series of TCCs at different focuses.

7. The computer-implemented method of simulating imaging performance of a lithographic process according to claim 2, wherein said function is defined as:

$$I(x,f,1+\epsilon)=I_0(x)+[\epsilon \cdot I_0(x)+(1+\epsilon)\cdot a(x)\cdot (f-f_0)+(1+\epsilon)\cdot b(x)\cdot (f-f_0)^2]$$

where I represents image intensity at actual focus and exposure, $I_0$ represents image intensity at nominal focus and exposure x is a point at which the image intensity is determined, $f_0$ represents nominal focus, f and $\epsilon$ represent an actual focus and exposure level at which the simulated image is calculated, and parameters "a" and "b" represent the aerial images computed from Transmission Cross Coefficients (TCCs) A and B which are first order and second order derivative TCCs with respect to focus change.

8. The computer-implemented method of simulating imaging performance of a lithographic process according to claim 1, wherein said simulated image corresponds to a resist image.

9. The computer-implemented method of simulating imaging performance of a lithographic process according to claim 8, wherein said function for simulating said resist image is defined as:

$$R=R_0+\epsilon \cdot P\{I_0\}+(1+\epsilon)\cdot (f-f_0)\cdot P\{a\}+(1+\epsilon)\cdot (f-f_0)^2 \cdot P\{b\}$$

where R represents image intensity at actual focus and exposure, $R_0$ represents image intensity at nominal focus and exposure, $I_0$ represents nominal aerial image, $f_0$ represents nominal focus, f and $\epsilon$ represent an actual focus and exposure level at which the simulated image is calculated, and parameters "a" and "b" represent first order and second order derivative aerial images with respect to focus change, $P\{\ \}$ denotes the functional action of applying a filter as a resist model.

10. A computer-implemented method of estimating feature edge shift or critical dimension (CD) change due to process window parameter variation of a lithographic process, said method comprising the steps of:
    determining, using a computer, a function for generating a simulated image, said function having one or more variables accounting for process window variations from a nominal process condition associated with said lithographic process; and
    generating, using the computer, said simulated image utilizing said function; said simulated image representing an imaging result of said target design for said lithographic process; and estimating, using the computer, said feature edge shift or CD change by analyzing said simulated image.

11. The computer-implemented method of estimating feature edge shift or CD change due to process window parameter variation of a lithographic process according to claim 10, wherein said function accounts for variations in focus and dose, said function being defined as:

$$\Delta EP(x_i, \varepsilon, f) = \frac{1}{S(x_i)}[\varepsilon \cdot P\{I_0(x_i)\} +$$
$$(1+\varepsilon)\cdot(f-f_0)\cdot P\{a(x_i)\} + (1+\varepsilon)\cdot(f-f_0)^2 \cdot P\{b(x_i)\}]$$

where ΔEP is the edge shift or change in edge placement, S represents resist image slope at nominal focus and exposure, $I_0$ represents nominal aerial image, $x_i$ is a point at which the image intensity is determined, $f_0$ represents nominal focus, f and ε represent an actual focus and exposure level at which the simulated image is calculated, and parameters "a" and "b" represent first order and second order derivative aerial images with respect to focus change, P{ } denotes a functional action of applying a filter as the resist model.

12. A computer program product having a non-transitory computer readable medium bearing a computer program for simulating imaging performance of a lithographic process utilized to image a target design having a plurality of features, the computer program, when executed, causing a computer to perform the steps of:
  determining a function for generating a simulated image, said function having one or more variables accounting for process window variations from a nominal process condition associated with said lithographic process; and
  generating said simulated image utilizing said function; said simulated image representing the imaging result of said target design for said lithographic process.

13. The computer program product of claim 12, wherein said function, includes a polynomial function of the process window variations, and said process window variations include variations in at least one of focus and exposure dose.

14. The computer program product of claim 13, wherein said process window variations further include variations in optical settings including at least one of numerical aperture and sigma.

15. The computer program product according to claim 12, wherein said function for generating simulated images is defined as:

$$I(x,f,1+\varepsilon)=I_0(x)+[\varepsilon\cdot I_0(x)+(1+\varepsilon)\cdot a(x)\cdot(f-f_0)+(1+\varepsilon)\cdot b(x)\cdot(f-f_0)^2]$$

where I represents image intensity at actual focus and exposure, $I_0$ represents image intensity at nominal focus and exposure, x is a point at which the image intensity is determined, $f_0$ represents nominal focus, f and ε represent an actual focus and exposure level at which the simulated image is calculated, and parameters "a" and "b" represent first order and second order derivative images with respect to focus change.

16. The computer program product according to claim 15, wherein said simulated image corresponds to a resist image.

17. The computer program product according to claim 16, wherein said function for simulating said resist image is defined as:

$$R=R_0+\varepsilon\cdot P\{I_0\}+(1+\varepsilon)\cdot(f-f_0)\cdot P\{a\}+(1+\varepsilon)\cdot(f-f_0)^2\cdot P\{b\}$$

where R represents image intensity at actual focus and exposure, $R_0$ represents image intensity at nominal focus and exposure, $I_0$ represents nominal aerial image, $f_o$ represents nominal focus, f and ε represent an actual focus and exposure level at which the simulated image is calculated, and parameters "a" and "b" represent first order and second order derivative aerial images with respect to focus change, P{ } denotes the functional action of applying a filter as a resist model.

18. The computer program product according to claim 12, wherein said function for generating simulated images is defined as:

$$I(x,f,1+\varepsilon)=I_0(x)+[\varepsilon\cdot I_0(x)+(1+\varepsilon)\cdot a(x)\cdot(f-f_0)+(1+\varepsilon)\cdot b(x)\cdot(f-f_0)^2]$$

where I represents image intensity at actual focus and exposure, $I_0$ represents image intensity at nominal focus and exposure x is a point at which the image intensity is determined, $f_0$ represents nominal focus, f and ε represent an actual focus and exposure level at which the simulated image is calculated, and parameters "a" and "b" represent best fit of a series of aerial images at different focuses.

19. The computer program product according to claim 12, wherein said function for generating simulated images is defined as:

$$I(x,f,1+\varepsilon)=I_0(x)+[\varepsilon\cdot I_0(x)+(1+\varepsilon)\cdot a(x)\cdot(f-f_0)+(1+\varepsilon)\cdot b(x)\cdot(f-f_0)^2]$$

where I represents image intensity at actual focus and exposure, $I_0$ represents image intensity at nominal focus and exposure, x is a point at which the image intensity is determined, $f_0$ represents nominal focus, f and ε represent an actual focus and exposure level at which the simulated image is calculated, and parameters "a" and "b" represent the aerial images computed from Transmission Cross Coefficients (TCCs) A and B which are linear combinations of a series of TCCs at different focuses.

20. The computer program product according to claim 12, wherein said function for generating simulated images is defined as:

$$I(x,f,1+\varepsilon)=I_0(x)+[\varepsilon\cdot I_0(x)+(1+\varepsilon)\cdot a(x)\cdot(f-f_0)+(1+\varepsilon)\cdot b(x)\cdot(f-f_0)^2]$$

where I represents image intensity at actual focus and exposure, $I_0$ represents image intensity at nominal focus and exposure, x is a point at which the image intensity is determined, $f_0$ represents nominal focus, f and ε represent an actual focus and exposure level at which the simulated image is calculated, and parameters "a" and "b" represent the aerial images computed from Transmission Cross Coefficients (TCCs) A and B which are first order and second order derivative TCCs with respect to focus change.

21. A computer program product having a non-transitory computer readable medium bearing a computer program for estimating feature edge shift or critical dimension (CD) change due to process window parameter variation of a lithographic process, the computer program, when executed, causing a computer to perform the steps of:
  determining a function for generating a simulated image, said function having one or more variables accounting for process window variations from a nominal process condition associated with said lithographic process;
  generating said simulated image utilizing said function; said simulated image representing an imaging result of a target design for said lithographic process; and
  estimating said feature edge shift or CD change by analyzing said simulated image.

22. The computer program product according to claim 21, wherein said function accounts for variations in focus and dose, said function being defined as:

$$\Delta EP(x_i, \varepsilon, f) = \frac{1}{S(x_i)} [\varepsilon \cdot P\{I_0(x_i)\} + (1+\varepsilon) \cdot (f-f_0) \cdot P\{a(x_i)\} + (1+\varepsilon) \cdot (f-f_0)^2 \cdot P\{b(x_i)\}]$$

where $\Delta EP$ is the edge shift or change in edge placement, S represents resist image slope at nominal focus and exposure, $I_0$ represents nominal aerial image, $x_i$ is a point at which the image intensity is determined, $f_0$ represents nominal focus, f and $\epsilon$ represent an actual focus and exposure level at which the simulated image is calculated, and parameters "a" and "b" represent first order and second order derivative aerial images with respect to focus change, P{ } denotes a functional action of applying a filter as the resist model.

* * * * *